(12) United States Patent
Kumar et al.

(10) Patent No.: US 11,437,211 B2
(45) Date of Patent: Sep. 6, 2022

(54) SOLID-STATE CIRCUIT BREAKER WITH SELF-DIAGNOSTIC, SELF-MAINTENANCE, AND SELF-PROTECTION CAPABILITIES

(71) Applicant: Atom Power, Inc., Charlotte, NC (US)

(72) Inventors: Binesh Kumar, Charlotte, NC (US); Davide Leoni, Charlotte, NC (US); Michael J. Harris, Charlotte, NC (US); Denis Kouroussis, Markham (CA)

(73) Assignee: Atom Power, Inc., Huntersville, NC (US)

( * ) Notice: Subject to any disclaimer, the term of this patent is extended or adjusted under 35 U.S.C. 154(b) by 0 days.

(21) Appl. No.: 17/010,122

(22) Filed: Sep. 2, 2020

(65) Prior Publication Data
US 2021/0066013 A1 Mar. 4, 2021

Related U.S. Application Data

(60) Provisional application No. 62/895,182, filed on Sep. 3, 2019.

(51) Int. Cl.
*H02H 7/08* (2006.01)
*H01H 71/12* (2006.01)
(Continued)

(52) U.S. Cl.
CPC ....... *H01H 71/123* (2013.01); *G01R 33/0023* (2013.01); *G01R 33/072* (2013.01); *H02H 7/0833* (2013.01)

(58) Field of Classification Search
CPC ........ H02H 3/006; H02H 3/025; H02H 3/335; H02H 3/08; H02H 3/0935; H02H 3/38;
(Continued)

(56) References Cited

U.S. PATENT DOCUMENTS 4,316,256 A 2/1982 Hendricks et al.
4,644,438 A 2/1987 Puccinelli et al.
(Continued)

FOREIGN PATENT DOCUMENTS

CN 1375923 A 10/2002
CN 1558248 A 12/2004
EP 3041101 A1 7/2016

OTHER PUBLICATIONS

International Search Report (ISR) and Written Opinion (WO) from PCT/US20/49018.
(Continued)

*Primary Examiner* — Bryan R Perez
(74) *Attorney, Agent, or Firm* — Patent Law Professionals, P.C.; William E. Winters

(57) ABSTRACT

A solid-state circuit breaker (SSCB) with self-diagnostic, self-maintenance, and self-protection capabilities includes: a power semiconductor device; an air gap disconnect unit connected in series with the power semiconductor device; a sense and drive circuit that switches the power semiconductor device OFF upon detecting a short circuit or overload of unacceptably long duration; and a microcontroller unit (MCU) that triggers the air gap disconnect unit to form an air gap and galvanically isolate an attached load, after the sense and drive circuit switches the power semiconductor device OFF. The MCU is further configured to monitor the operability of the air gap disconnect unit, the power semiconductor device, and other critical components of the SSCB and, when applicable, take corrective actions to prevent the SSCB and the connected load from being damaged or destroyed and/or to protect persons and the environment from being exposed to hazardous electrical conditions.

62 Claims, 24 Drawing Sheets

(51) Int. Cl.
*G01R 33/00* (2006.01)
*G01R 33/07* (2006.01)

(58) Field of Classification Search
CPC ............ H02H 3/33; H02H 3/20; H02H 3/085;
H02H 3/021; H02H 7/30; H02H 1/0015;
H02H 1/0007; H02H 1/0092; H01H
59/0009; H01H 9/542; H01H 9/54; H01H
9/548; H01H 9/56; H01H 9/563; H01H
71/1081; H01H 71/04; H01H 71/128;
H01H 71/24; H01H 33/596; H01H
33/593; H01H 2009/543; H01H 2009/546
See application file for complete search history.

(56) References Cited

U.S. PATENT DOCUMENTS

| | | | |
|---|---|---|---|
| D288,921 S | 3/1987 | Peck | |
| D305,019 S | 12/1989 | Pena et al. | |
| 5,132,865 A | 7/1992 | Mertz et al. | |
| D331,063 S | 11/1992 | Pasierb | |
| D334,542 S | 4/1993 | Lowe et al. | |
| D351,861 S | 10/1994 | Anderson et al. | |
| 5,502,286 A | 3/1996 | Pollman et al. | |
| 5,638,038 A | 6/1997 | Suzuki et al. | |
| D393,808 S | 4/1998 | Lindsey et al. | |
| 5,782,341 A | 7/1998 | Calder et al. | |
| 6,008,971 A | 12/1999 | Duba et al. | |
| D435,021 S | 12/2000 | Davis et al. | |
| D443,586 S | 6/2001 | Sakasegawa | |
| D443,595 S | 6/2001 | Pawley | |
| 8,582,265 B2 | 11/2013 | Britz | |
| D695,234 S | 12/2013 | Santiago et al. | |
| D697,033 S | 1/2014 | Hashimoto et al. | |
| 8,861,162 B2 | 10/2014 | Fuller et al. | |
| 9,287,065 B1 | 3/2016 | Davis et al. | |
| D754,615 S | 4/2016 | Chen et al. | |
| D768,582 S | 10/2016 | Jacoby et al. | |
| D784,168 S | 4/2017 | Jacoby et al. | |
| 10,134,551 B2 | 11/2018 | Potter et al. | |
| 10,541,530 B2 | 1/2020 | Kennedy et al. | |
| 2001/0026185 A1 | 10/2001 | Sher | |
| 2002/0093774 A1 | 7/2002 | Chung | |
| 2007/0121257 A1 | 5/2007 | Maitra et al. | |
| 2009/0290275 A1 | 11/2009 | Staszesky et al. | |
| 2010/0232082 A1 | 9/2010 | Seger | |
| 2011/0026185 A1 | 2/2011 | Boudet et al. | |
| 2011/0080677 A1 | 4/2011 | Radosavljevic et al. | |
| 2011/0102052 A1 | 5/2011 | Billingsley et al. | |
| 2011/0222200 A1 | 9/2011 | Fuller et al. | |
| 2011/0292556 A1 | 12/2011 | Britz | |
| 2012/0218676 A1 | 8/2012 | Demetriades et al. | |
| 2013/0027829 A1 | 1/2013 | Antoniazzi et al. | |
| 2014/0029153 A1 | 1/2014 | Besana et al. | |
| 2015/0084420 A1 | 3/2015 | Dickerson et al. | |
| 2015/0236502 A1 | 8/2015 | Xu et al. | |
| 2015/0348722 A1 | 12/2015 | Fraser et al. | |
| 2016/0197465 A1 | 7/2016 | Poulose et al. | |
| 2016/0243951 A1 | 8/2016 | Pritelli et al. | |
| 2016/0294179 A1* | 10/2016 | Kennedy | H02H 7/261 |
| 2017/0004948 A1 | 1/2017 | Leyh | |
| 2017/0069441 A1 | 3/2017 | Mishrikey et al. | |
| 2017/0256934 A1* | 9/2017 | Kennedy | H02H 3/42 |
| 2018/0366936 A1 | 12/2018 | Kennedy et al. | |
| 2020/0365346 A1 | 11/2020 | Telefus et al. | |

OTHER PUBLICATIONS

International Search Report (ISR) and Written Opinion (WO) from PCT/US20/037158 (REF1).

International Search Report (ISR) and Written Opinion (WO) from PCT/US20/037163 (REF2).

P. Meckler, "Does and Electronic Circuit Breaker need Electrical Contacts?", Proceedings of the 50th IEEE Holm Conference on Electrical Contacts and The 22nd International Conference on Electrical Contacts, pp. 480-487, 2004.

Senior Design Team Works with Atom Power to Design Revolutionary Circuit Breaker, dated Jan. 29, 2016, [online], [site visited Aug. 1, 2017], Available from Internet <URL: https://isl.uncc.edu/news/2016-01-29/senior-design-team-works-atom-power-design-revolutionary-circuit-breaker>.

Eaton's New Narrow Frame Power And Air Circuit Breaker Offers Reduced Size And Improved Safety, dated Jun. 23, 2009, [online], [site visited Mar. 4, 2018]. Available from Internet, <URL: https://www.eaton.com/Eaton/OurCompany/NewsEvents/NewsReleases/CT_238199>.

Dual On/Off Push Button, dated Apr. 26, 2014, [online], [site visited Aug. 1, 2017]. Available from Internet, <URL: http://www.signaworks.com/products/industrial-push-buttons/dual-on/off-push-button.html>.

Function and rated characteristics of circuit breaker—all things need to know of circuit breaker, dated Oct. 20, 2013, [online], [site visited Mar. 4, 2018]. Available from Internet, <URL: http://eblogbd.com/details-characteristics-circuit-breaker/>.

J. Kiedaisch, "How the World's First Digital Circuit Breaker Could Completely Change the Powered World," Popular Mechanics, May 22, 2019. Available from Internet: <URL: https://www.popularmechanics.com/technology/infrastructure/a27557804/digital-circuit-breaker/>.

International Search Report (ISR) and Written Opinion (WO) from PCT/US20/37158.

International Search Report (ISR) and Written Opinion (WO) from PCT/US20/37163.

* cited by examiner

SOLID-STATE CIRCUIT BREAKER WITH SELF-DIAGNOSTIC, SELF-MAINTENANCE, AND SELF-PROTECTION CAPABILITIES

CROSS-REFERENCE TO RELATED APPLICATIONS

This application claims the benefit of U.S. Provisional Patent Application No. 62/895,182, filed Sep. 3, 2019.

BACKGROUND OF THE INVENTION

Circuit breakers are used in electrical distribution systems to protect electrical circuits and their loads from short circuits and overloads. Conventional circuit breakers have an electromechanical construction, typically including an electromagnet that operates to separate the breaker's contacts as quickly as possible when a short circuit occurs, and a thermally responsive bimetallic strip that separates the circuit breaker's contacts after an overload has persisted in the circuit for an unacceptably long duration time.

Although conventional circuit breakers are effective at isolating faults once they have tripped, one significant drawback they have is that they are slow—typically requiring several milliseconds to respond to and isolate a fault. To circumvent this limitation, efforts have been made in recent years to adapt high-power semiconductors (i.e., "solid-state" devices) for circuit breaker applications. Solid-state devices are attractive since they can be controlled to isolate a fault in a matter of microseconds, compared to the several milliseconds it typically takes a conventional circuit breaker to isolate a similar fault. The fast reaction time is beneficial since t reduces the risk of fire, damage to electrical equipment, and the possibility of arc flashes occurring. Further, because the operating characteristics of solid-state devices vary little from one part to another, circuit breakers can be constructed from solid-state devices that exhibit precise and well-controlled time-current characteristics. This is unlike conventional circuit breakers, which, due to their thermal, magnetic and mechanical construction, exhibit wide variances in their time-current characteristics.

Given their s advantages, solid-state circuit breakers have the potential to supplant conventional circuit breakers in the not too distant future. In order for that transition to occur, however, solid-state circuit breakers will need to be designed so that they are durable and capable of operating for long periods of time unattended, i.e., without requiring an inordinate amount of human-involved oversight and maintenance. Consistent with that goal, it would be desirable for the solid-state circuit breaker to have the ability monitor its own critical functions, identify any deviations from its intended operation, diagnose and predict causes and sources of failure, protect itself from dangerous conditions that might otherwise lead to its destruction and/or harm to persons and the environment, and lock itself down to electrically and galvanically isolate its associated load when conditions warrant.

BRIEF SUMMARY OF THE INVENTION

A solid-state circuit breaker (SSCB) with self-diagnostic, self-maintenance, and self-protection capabilities is disclosed. An exemplary embodiment of the SSCB includes a power semiconductor device; an air gap disconnect unit connected in series with the power semiconductor device; a sense and drive circuit that switches the power semiconductor device OFF upon detecting a short circuit or overload of unacceptably long duration; and a microcontroller unit (MCU) that triggers the air gap disconnect unit to form an air gap and galvanically isolate an attached load, after the sense and drive circuit switches the power semiconductor device OFF. The MCU is further configured to monitor the operability of the air gap disconnect unit, the power semiconductor device, and other critical components of the SSCB and, when applicable, take corrective actions to prevent the SSCB and the connected load from being damaged or destroyed and/or to protect persons and the environment from being exposed to hazardous electrical conditions.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 1:
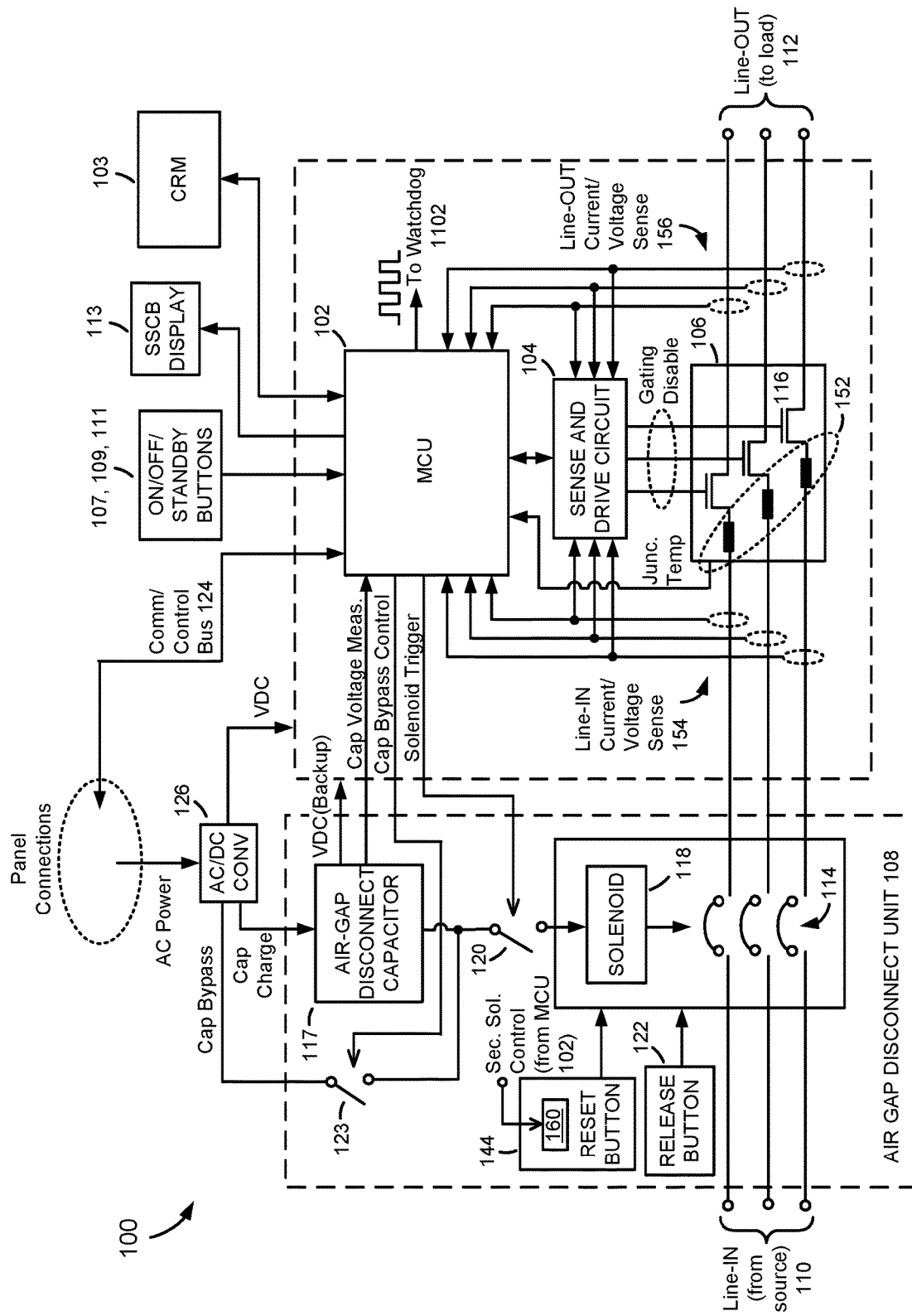
FIG. 1 is a block diagram drawing of a solid-state circuit breaker (SSCB), according to one embodiment of the present invention.

Referring to FIG. 1, there is shown a block diagram of a solid-state circuit breaker (SSCB) 100 with self-diagnostic, self-maintenance, and self-protection capabilities, according to one embodiment of the present invention. The principal components of the SSCB 100 include: a microcontroller unit (MCU) 102; a sense and drive circuit 104, a field-effect transistor (FET) power module 106; and an air gap disconnect unit 108. The air gap disconnect unit 108 has three air-gap contact switches 114 and the FET power module 106 has three power FETs 116, each one of which is configured so that its drain-source path is in series with one of the air gap contact switches 114. In other words, the FET power module 106 and air gap disconnect unit 108 are connected in series, between the Line-IN terminals and Line-OUT terminals 110 and 112. During normal operating conditions, the three air-gap contact switches 114 in the air gap disconnect unit 108 are closed and the three power FETs 116 in the FET power module 106 are ON. This allows line currents entering the Line-IN terminals 110 from a power source (e.g., alternating currents (AC) distributed to the SSCB 100 Line-IN terminals 110 from within a distribution panel) to flow to a load (not shown) connected to the Line-OUT terminals 112 (e.g., via electrical cables routed to the load in a commercial building or residence). However, upon the SSCB 100 detecting a short circuit or overload of unacceptably long duration, the sense and drive circuit 104 switches the power FETs 116 OFF to prevent any further current from flowing to the load. Meanwhile, or shortly after the power FETs 116 are switched OFF, the MCU 102 generates a solenoid trigger signal, which the air gap disconnect unit 108 responds to, to 'disengage,' open the air gap contact switches 114 and galvanically isolate the load. Note that the exemplary embodiment of the SSCB 100 depicted in FIG. 1 and in other drawings in this disclosure is a three-phase device. Accordingly, it has three Line-IN terminals 110, three airgap contact switches 114, three power FETs 116, and three Line-OUT terminals 112. A single-phase version of the SSCB would have just one of each of these components, as will be appreciated and understood by those of ordinary skill in the art. It should also be mentioned that in a preferred embodiment of the invention the power FETs 116 comprise silicon carbide (SiC) MOSFETs. However, other types of power semiconductor devices may be alternatively used (e.g., GaN high electron mobility transistors (HEMTs)), as will be appreciated and understood by those of ordinary skill in the art.

Figure 3:
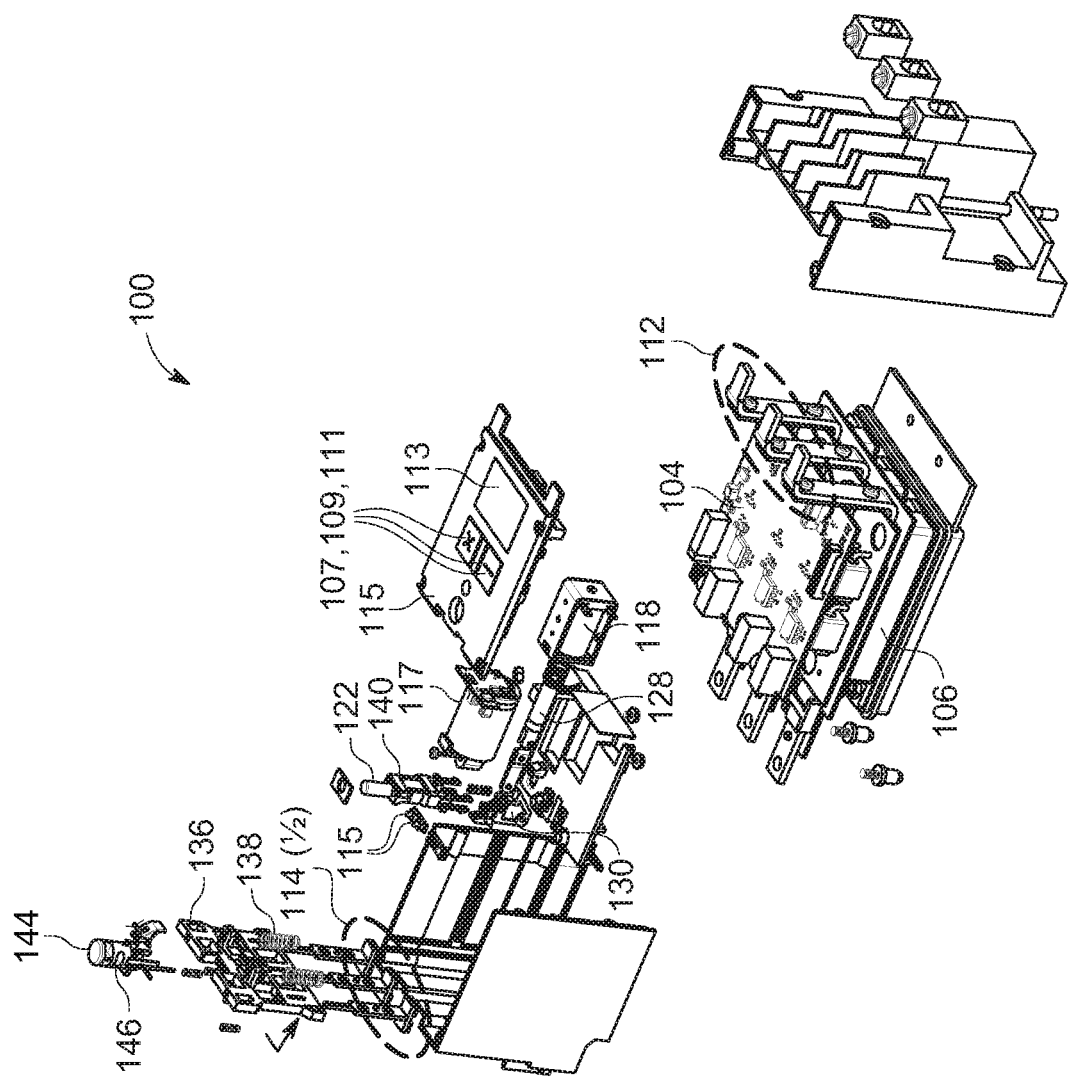
FIG. 3 is an exploded view drawing of the SSCB depicted in FIG. 1, further revealing some of its salient components, according to one embodiment of the present invention.
Figure 4:
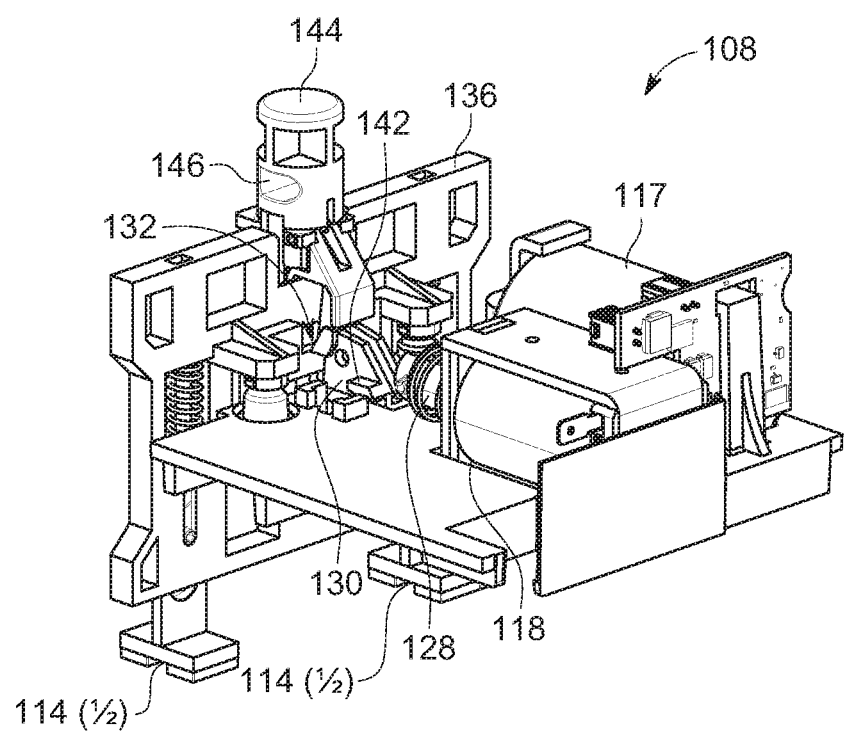
FIG. 4 is a perspective view drawing of the air gap disconnect unit of the SSCB depicted in FIG. 1, according to one embodiment of the present invention.

When the SSCB 100 is in the 'tripped' state, the power FETs 116 are fully capable by themselves of isolating the load from the input power source. However, because governmental, regulatory, and certification bodies usually require the load to be galvanically isolated from the input power source when the circuit breaker is in the tripped state, the SSCB 100 is preferably (though not necessarily in every embodiment of the invention) equipped with the air gap disconnect unit 108, which, when 'disengaged,' forms an air gap between the Line-IN and Line-OUT terminals 110 and 112. Among other components, the air gap disconnect unit 108 includes a large (i.e., high capacitance) air gap disconnect capacitor 117 (for example, 10,000 microfarads or higher), a solenoid 118, and a switch 120 that selectively couples the terminals of the air gap disconnect capacitor 117 across the coil of the solenoid 118. The physical relationship of the air gap disconnect capacitor 117 and the solenoid 118 in one exemplary embodiment of the SSCB 100 can be seen in the perspective and exploded view drawings of the SSCB 100 presented in FIGS. 2 and 3, as well as the perspective view of the air gap disconnect unit 108 by itself in FIG. 4.

In one embodiment of the invention, the air gap disconnect unit 108 is designed so that it can be triggered to disengage and form an air gap between the Line-IN and Line-OUT terminals 110 and 112 automatically (by actuating the solenoid 118), manually (without the assistance of the solenoid 118 but in response to a person pressing a RELEASE button 122), or in response to a command from a local or remote computer that is configured to interact with the SSCB 100 via a communications and control (comm/control) bus 124. Automatic triggering occurs upon the sense and drive circuit 104 detecting a short circuit or other electrical anomaly (e.g., overload of unacceptably long duration) in the SSCB's 100's load circuit. When that occurs, the sense and drive circuit 104 generates and applies gating disable signals to the gates of the power FETs 116 in the FET power module 106, causing the power FETs 116 to switch OFF in a matter of microseconds. The power FETs 116 can also be instructed to delay their switch OFF to allow for switch OFF during a zero cross of the current. The ability to switch OFF during a zero point of current reduces the disturbance in the upstream power system. Meanwhile or shortly after the power FETs 116 have been switched OFF, the MCU 102 generates a solenoid trigger signal, which closes switch 120 (see FIG. 1) so that the terminals of the air gap disconnect capacitor 117 are connected across the coil of the solenoid 118. The SSCB 100 is designed so that the air gap disconnect capacitor 117 remains charged during normal operating conditions. In one embodiment of the invention, an AC/DC converter 126, which serves as the main DC power supply for the DC powered electronics in the SSCB 100 (e.g., the MCU 102, CRM 103, and DC components on the sense and drive circuit board 104), is further configured to charge the air gap disconnect capacitor 117 and maintain it in a fully charged state. Accordingly, when the solenoid trigger signal is applied to switch 120 to cause it to close and the terminals of the air gap disconnect capacitor 117 are then connected across the coil of the solenoid 118, a large current begins to flow through the solenoid's coil. The large coil current creates, in turn, a magnetic field that causes the solenoid 118 to pull its plunger 128 inside the solenoid's housing. As the plunger 128 is pulled into the solenoid housing it engages a latch 130, which rotates about a pivot and swings away from a top lip 132 of a holster 136. (See FIGS. 2-4.) Under normal operating conditions, the latch 130 is positioned so that it holds the holster 136 down (by pressing down on the top lip 132), thereby keeping the air gap contact switches 114 closed. However, when the solenoid 118 is triggered and the solenoid's 118's plunger 128 causes the latch 130 to rotate and swing away from the top lip 132, the latch 130 no longer holds the holster 136 down and normally-compressed disconnect springs 138 decompress to force holster 136 upwards. Forcing the holster 136 up causes the air gap contact switches 114 to open, resulting in formation of an air gap between the Line-IN and Line-OUT terminals 110 and 112. This air gap galvanically isolates the load from the input power source applied to the Line-IN terminals 110, so with the power FETs 116 OFF and the air gap disconnect unit 108 disengaged with an air gap formed between the Line-IN and Line-OUT terminals 110 and 112, the SSCB 100 is in a fully 'tripped' state.

In one embodiment of the invention the air gap disconnect unit 108 is further designed so that it can be disengaged manually, specifically, in response to a person pressing RELEASE button 122. When a person presses the RELEASE button 122, linking member 140 (see FIGS. 2-4) pushes against a cammed surface 142 on the latch 130, causing the latch 130 to rotate and release (disengage) from the top lip 132 of the holster 136 and allowing normally-compressed disconnect spring 138 to decompress and force holster 136 up to open air gap contact switches 114 and form the air gap. As the holster 136 is forced up, it also pushes against and lifts a RESET button 144 to expose lockouttagout (LOTO) hole 146, through which a service or maintenance (service/maintenance) worker can insert a padlock or other locking device to complete LOTO safety procedure. Note that RESET button 144 will pop up to reveal LOTO hole 146 whether the air gap disconnect unit 108 is triggered to disengage automatically (by the MCU 102 actuating the solenoid 118) or manually (by a person pressing RELEASE button 122). Completing the LOTO safety procedure ensures that the service/maintenance worker or other person will not inadvertently or accidentally reengage the air gap disconnect unit 108. After service/maintenance has been completed, the service/maintenance worker can then remove the padlock or other locking device and reengage the air gap disconnect unit 108 by pushing RESET button 144. As the RESET button 144 is pressed it engages the holster 136 and recompresses the disconnect springs 138. It also engages the rotating latch 130, so that it reengages the top lip 132 of the holster 136, to hold the holster 136 down once again and close the air gap contact switches 114. Further details of an SSCB 100 that includes a similar air gap disconnect unit can be found in co-pending and commonly assigned U.S. patent application Ser. No. 16/898,538, entitled "Solid-State Circuit Breaker with Galvanic Isolation," which is incorporated herein by reference.

It should be mentioned that the SSCB 100 preferably includes an additional lockout mechanism 160 that can be activated by the SSCB 100 itself (i.e., without any human participation) to prevent the RESET button 144 from being pressed and the air gap disconnect unit 108 from being re-engaged when conditions warrant. This additional lockout mechanism 160 can be activated by the SSCB 100 regardless of whether a padlock or other locking device is inserted through the LOTO hole 146 of the RESET button 144. In one embodiment of the invention the additional lockout mechanism 160 includes a secondary solenoid smaller in size compared to the primary solenoid 118 used to disengage the air gap disconnect unit 108. After the MCU 102 has determined that one of the SSCB's 100's principal components or critical functions has failed or is likely failing and the MCU 102 has triggered the primary solenoid 118 to disengage the air gap disconnect unit 108 (for example, after performing one of the various self-diagnostic, self-maintenance, and self-protection methods described herein), it triggers the secondary solenoid. The plunger of the secondary solenoid is configured so that it engages the RESET button 144 (or engages some other mechanical linkage connected to the RESET button 144) and prevents the RESET button 144 from being pressed into the SSCB's 100's enclosure. The secondary lockout mechanism 160 thus prevents a person from attempting to re-engage the air gap disconnect unit 108 after the SSCB 100 has determined that hazardous conditions may be present and/or has determined that one of its principal components or critical functions has/have failed or is likely failing.

Figure 2:
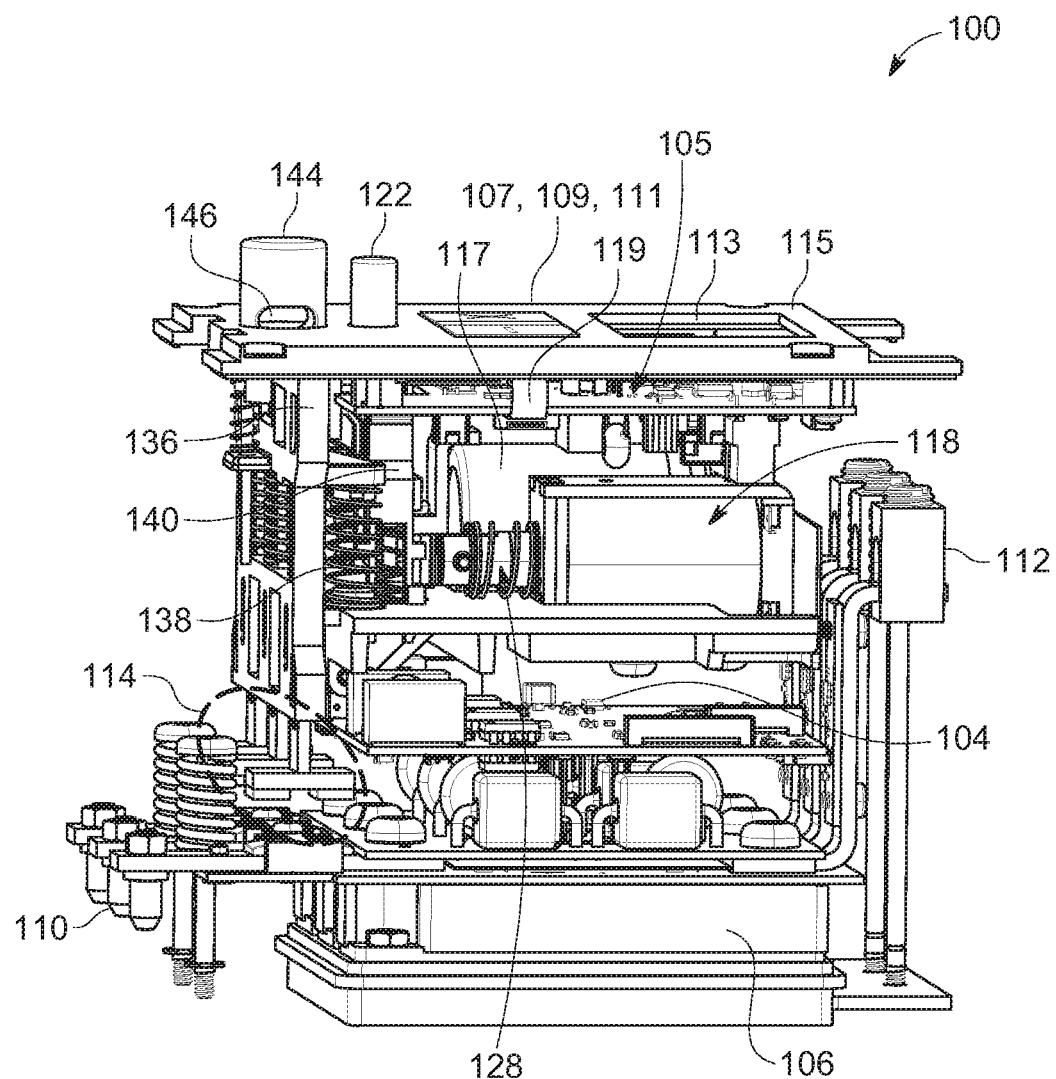
FIG. 2 is a perspective view drawing of the SSCB depicted in FIG. 1, revealing some of its salient components, according to one embodiment of the present invention.

In the exemplary embodiment of the SSCB 100 depicted in FIGS. 1 and 2, the MCU 102 is mounted on a control board 105, along with computer readable memory (CRM) 103. The CRM 103 comprises flash memory and/or electrically erasable read only memory (EPROM) for storing firmware and software that directs the MCU's 102's operation, as well as random access memory (RAM) which the MCU 102 utilizes in executing the firmware and software instructions. As will be appreciated by those of ordinary skill in the art, the CRM 103 may be external to the MCU 102 (as depicted in FIG. 1), embedded in the MCU 102, or may comprise computer readable memory that is partly embedded in the MCU 102 and partly external to the MCU.

Figure 5:
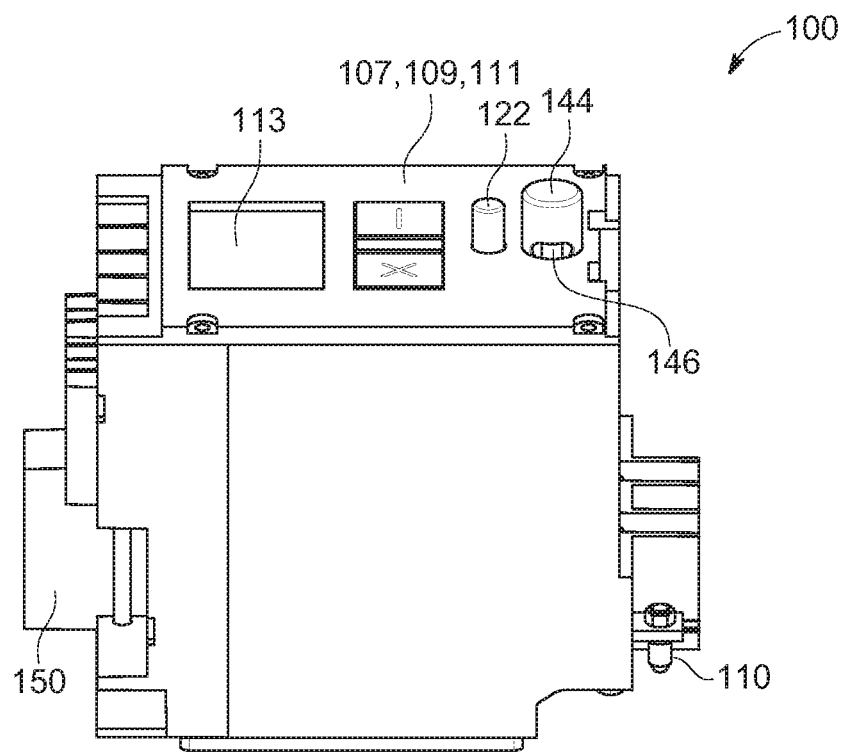
FIG. 5 is a front perspective view drawing of the SSCB depicted in FIG. 1, illustrating how it is preferably housed within a housing and revealing the SSCB's electronic display, ON/OFF/STANDBY buttons, and air gap disconnect unit RESET and RELEASE buttons, according to one embodiment of the present invention.
Figure 6:
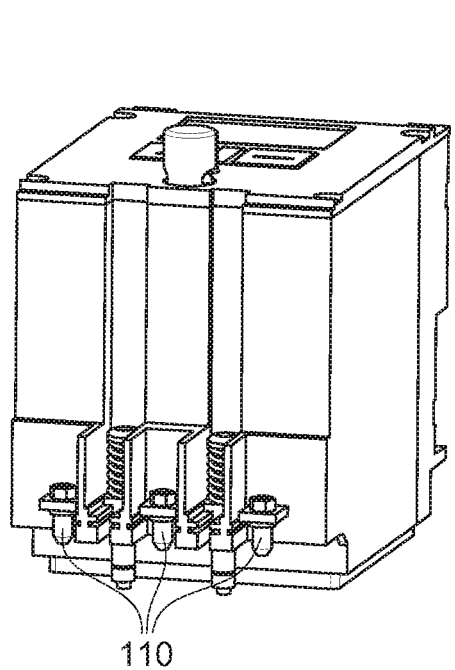
FIG. 6 is a line-side perspective view drawing of the SSCB depicted in FIG. 1, revealing the SSCB's Line-IN terminals, according to one embodiment of the present invention.
Figure 7:
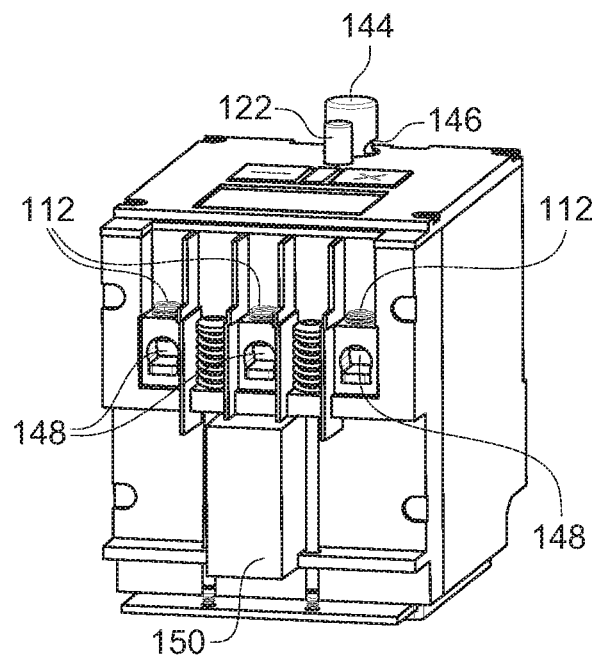
FIG. 7 is a load-side perspective view drawing of the SSCB depicted in FIG. 1, revealing the SSCB's Line-OUT terminals, according to one embodiment of the present invention.

Preferably the SSCB 100 is enclosed within a housing (i.e., an 'enclosure'), as illustrated in FIGS. 5-7, and includes ON, OFF, and STANDBY buttons (ON/OFF/STANDBY) 107, 109 and 111 that a person can press and an electronic display 113. In one embodiment of the SSCB 100 the electronic display 113 is an electronic ink display, which is a display technology that allows information currently being displayed to continue to be displayed even if electrical power to the display is disrupted or completely removed. (Note that ribbon cable 119 (see FIG. 2) provides the electrical connectivity between the control board 105 and the ON/OFF/STANDBY buttons 107, 109 and 111.) In one embodiment of the invention the ON/OFF/STANDBY buttons 107, 109 and 111 are translucent and colored green, red, and yellow, respectively, and light-emitting diodes (LEDs) (not shown in the drawings) are configured beneath each button. Whichever LED is illuminated indicates and emphasizes the present state of the SSCB 100. Specifically, when the ON button 107 (the green colored button with the "I" indicator) is pressed ON and its underlying LED is illuminated, the green emphasis indicates that the SSCB 100 is in a fully operational state (air gap disconnect unit 108 engaged (air gap contact switches 114 closed) and power FETs 116 in FET power module 106 ON). When the STANDBY button 109 (yellow button marked with an 'X") is pressed and its underlying LED is illuminated, the yellow emphasis indicates that the SSCB 100 is in a standby state (air gap disconnect unit 108 engaged but power FETs 116 in FET power module 106 OFF). (Note that a transition from the STANDBY state to the ON state, can then be made, if desired, by simply pushing the ON (green) button 107.) Finally, the OFF red button 111, which is not actually a pressable button in the exemplary embodiment of the SSCB 100 described here (but could be in an alternative design) is illuminated by its underlying LED when both the air gap disconnect unit 108 is disengaged (air gap contact switches 114 open) and the power FETs 106 in FET power module 116 are OFF. The red emphasis indicates that the SSCB 100 is in a 'tripped,' i.e., fully OFF state (power FETs 116 in FET power module 106 OFF and air gap disconnect unit 108 disengaged). The reason that the OFF red button 111 does not need to be a pressable button is that that functionality is already provided by RELEASE button 122, which when pressed causes the SSCB's electronics and driver circuitry to switch the power FETS 116 in FET power module 106 OFF and soon thereafter trigger the air gap disconnect unit 108 to disengage.

FIG. 7, which is a load-side perspective view of the enclosed SSCB 100, reveals the Line-OUT terminals 112, which in this particular exemplary embodiment include load-side connection lugs 148, to which power cables can be connected and routed to the load. It also reveals a communications and control (comm/control) bus shield 150 which protects an electrical comm/control bus connector that connects the SSCB 100 to the comm/control bus 124 when the SSCB 100 is installed in a panelboard, similar to as described in co-pending and commonly assigned U.S. patent application Ser. No. 16/898,569, entitled "Distribution Panel for Intelligently Controlled Solid-State Circuit Breakers," which is incorporated herein by reference. The comm/control bus 124, which may be an inter-IC (I2C) or controller area network (CAN) bus, for example, provides the SSCB 100 the ability to communicate with, and to be controlled by, a local or remote computer, similar to as described in commonly assigned U.S. Pat. No. 10,541,530, entitled "Hybrid Air-Gap/Solid-State Circuit Breaker," and commonly assigned U.S. Pat. No. 10,276,321, entitled "Dynamic Coordination of Protection Devices in Electrical Distribution Systems," both which are also incorporated herein by reference. It also provides the SSCB 100 the ability to report its operational status (in real time or non-real-time) to the local or remote computer, for example, after performing a set of scheduled or on-demand diagnostic tests, as will be explained in further detail below.

The control board 105 serves as the 'brains' of the SSCB 100 and in one exemplary embodiment of the SSCB 100 includes the MCU 102 and CRM 103. The firmware and other computer program instructions (i.e., software) stored in the CRM 103 and retrieved and executed by the MCU 102 control the general operation of the SSCB 100, including instructions that determine and control if, how, and when the MCU 102 interacts with other components in the SSCB 100, and instructions and protocol that allow the MCU 102 to communicate with, and to be controlled by, other devices (e.g., an external computer) over the comm/control bus 124. In some embodiments of the SSCB 100 the computer program instructions further include instructions which when executed by the MCU 102 give the MCU 102 the ability to: 1) monitor and diagnose the vitality, efficacy, and operability of the air gap disconnect unit 108, including determining, when appropriate or necessary, whether the air gap disconnect unit 108 has failed open or failed closed; 2) monitor and diagnose the vitality, efficacy, and operability of the power FETs 116 in the FET power module 106 and direct the sense and drive circuit 104 to switch the power FETs 116 OFF when conditions warrant; 3) generate the solenoid trigger signal to cause the air gap disconnect unit 108 to disengage and form an air gap between the Line-IN and Line-OUT terminals 110 and 112 when conditions warrant; 4) monitor the vitality, efficacy, and operability of the AC/DC converter 126 and direct the sense and drive circuit 104 to switch the power FETs 116 OFF if the AC/DC converter 126 has failed or is determined to be failing (using, if necessary, energy stored in the air gap disconnect capacitor 117); 5) monitor and diagnose the vitality, efficacy, and operability of the air gap disconnect capacitor 117 and generate a capacitor bypass signal that allows the AC/DC converter 126 to bypass the air gap disconnect capacitor 117 if the MCU 102 determines that the air gap disconnect capacitor 117 has failed or is failing; 6) generate a watchdog signal that an external watchdog utilizes to monitor the vitality, efficacy, and operability of the MCU 102; 7) monitor and diagnose failures and likely or probable failures of the current and voltage sensors 154 and 156 used to sense the line currents and voltages at the inputs and outputs of the FET power module 106; 8) monitor the vitality, efficacy, and operability of surge protection devices (SPDs) that serve to prevent the power FETs 116 from being exposed to high voltages, and locking the SSCB 100 down if one or more of the SPDs has/have failed or has/have degraded beyond their practical utility; 9) direct and control the SSCB's 100's electronic display 113 to display information (both real-time and non-real-time) concerning the vitality, efficacy, and operability of the SSCB 100 and its various components; 10) report information (both real-time and non-real-time) concerning the vitality, efficacy, and operability of the SSCB 100, via the comm/control bus 124, to the system overseer (e.g., electrician, residence/building owner, or electrical utility); and 11) recommend corrective actions the system overseer might possibly take to address or remedy any particular failure or problem the SSCB 100 may have experienced or is currently experiencing. A recommended corrective action could include, for example, turning OFF an upstream circuit breaker (which might also be an SSCB similar in construction to the exemplary SSCB 100 described herein) based on a fault diagnosed in a downstream SSCB. Taking such corrective action would reduce the risk to downstream equipment should the fault compromise or eliminate the downstream SSCB's protective functions. These and other functions and capabilities of the SSCB 100 are discussed in further detail below.

Figure 8:
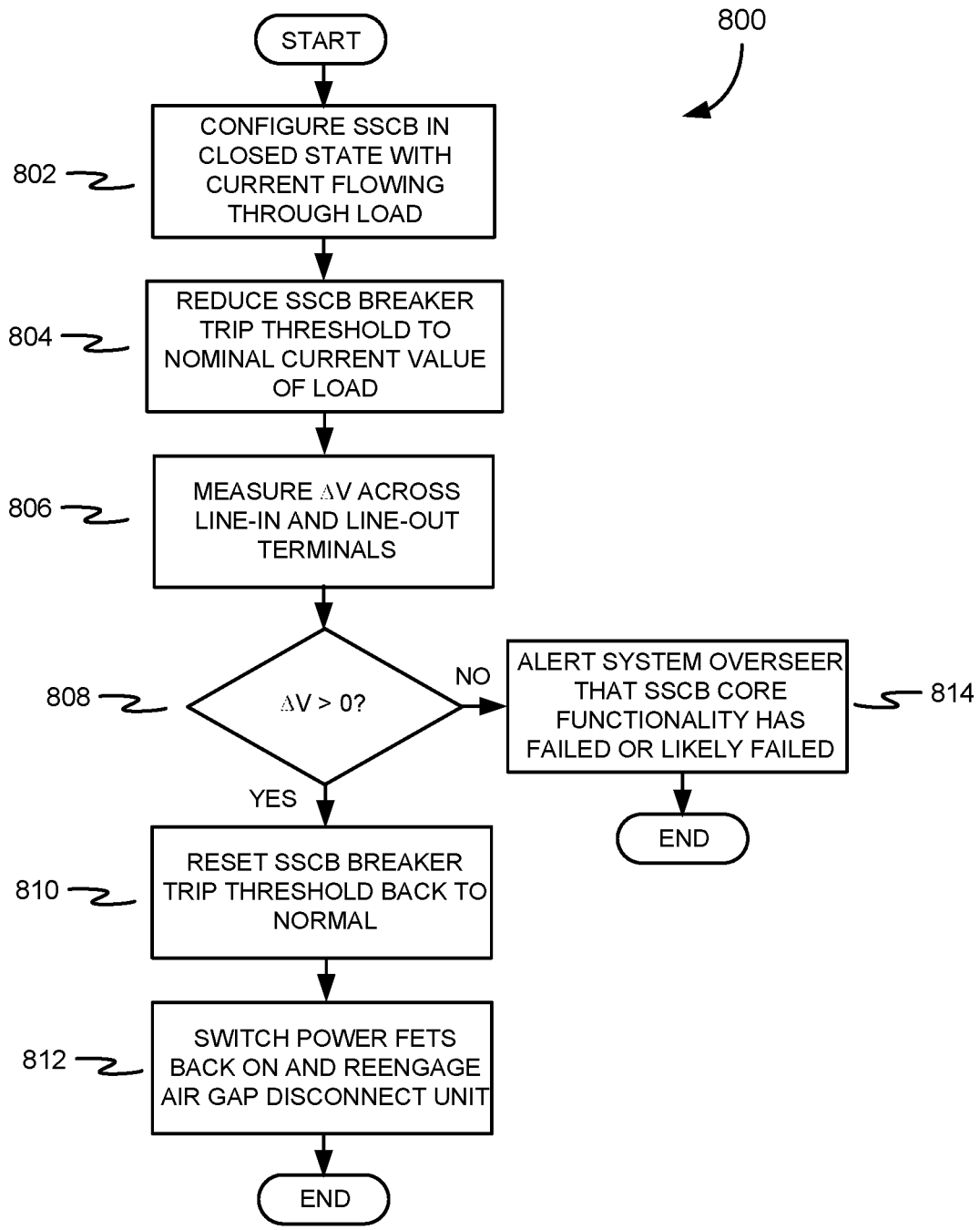
FIG. 8 is a flowchart illustrating a method the MCU of the SSCB performs to monitor the core functionality of the SSCB, and how the MCU responds when it determines that the SSCB's core functionality has failed or likely failed, according to one embodiment of the present invention.

FIG. 8 is a flowchart illustrating a method 800 the MCU 102 performs (together with other cooperating components of the SSCB 100) to verify the basic (i.e., "core") functionality of the SSCB 100, and what actions the MCU 102 takes upon determining that the core functionality of the SSCB 100, specifically, tripping when required, has failed or likely failed. According to this method, the SSCB 100 is assumed to be configured in an electrical distribution system with an input power source (e.g., the AC mains) attached to the SSCB's line-IN terminals 110 and a load attached to the line-OUT terminals 112. First, at step 802 the SSCB 100 is switched ON (power FETs closed and air gap disconnect unit engaged (no air gap). At step 804 the MCU 102 reduces the trip threshold of the SSCB 100 to and past the nominal current of the load. If the SSCB's core functionality is operating properly, the SSCB 100 should trip (power FETs 116 open, air gap disconnect unit disengages) as the trip threshold is adjusted below the nominal load current. To determine whether the SSCB 100 did trip, as intended, step 806 is performed. Specifically, at step 806 the MCU 102 determines the voltage difference $\Delta V$ between the line-IN and line-OUT terminals 110 and 112. If, at decision 808, $\Delta V$ is determined to be sufficiently greater than zero to indicate galvanic isolation of the load ("YES" at decision 808), the MCU 102 is able to properly conclude that the SSCB's core functionality is operating correctly, the trip threshold is set back to normal at step 810, and at step 812 the power FETs 116 are quickly switched back ON (so current to the load is interrupted only briefly during the test), the air gap disconnect unit 108 is reengaged to close the air gap, and the method 800 ends. However, if at decision 808 the MCU 102 determines that $\Delta V$ between the line-IN and line-OUT terminals 110 and 112 is zero or not sufficiently greater than zero to indicate proper galvanic isolation ("NO" at decision 808), the MCU 102 concludes that the SSCB's core functionality has failed and at step 814 alerts the system overseer that SSCB's core functionality has failed. Failure of the SSCB's 100's core functionality could be attributable to, for example, a damaged power FET 116 in the FET power module 106, a malfunctioning air gap disconnect unit 108, a damaged or destroyed sense and drive circuit 104, a damaged current and/or current and voltage sensor 154 and 156, or could have been caused by some other damaged or malfunctioning component. In some embodiments of the invention the MCU 102 reports the failure to a remote computer, via the comm/control bus 124, and/or directs the SSCB to display the failure information on the SSCB's electronic display 113. To further isolate and identify the source of the core functionality failure, some or more of the diagnostics tests discussed below can be performed following a "NO" at decision 808.

In the core functionality diagnostic method 800 just described the air gap disconnect unit 108 must be re-engaged (e.g., by a user pressing the RESET button 144) after the core functionality of the SSCB 100 has been verified (i.e., following a "YES" at decision 808). In an alternative method, the MCU 102 does not trigger the air gap disconnect unit 108 to disengage during the core functionality diagnostic check, but instead maintains the air gap disconnect unit 108 in an engaged position throughout the test (no air gap between the line-IN and line-OUT terminals 110 and 112). According to this alternative approach, if at decision 808 the MCU 102 determines that $\Delta V$ is zero or not sufficiently greater than zero ("NO" at decision 808), the MCU 102 is able to properly conclude that either one or more of the power FETs 116 has/have failed and/or that one or more of the current/voltage sensors 154 and 156 has/have failed or has/have likely failed, and at step 814 the system overseer is then alerted of the failure or likely failure. One benefit of this alternative core functionality diagnostic check is that there is no need for a person (i.e., "user") to re-engage the air gap disconnect unit 108 following the diagnostic check (since the MCU 102 does not trigger the air gap disconnect unit 108 to disengage during the check). Another benefit is that the speed of the diagnostic check is much faster compared to the approach in which the air gap disconnect unit 108 is disengaged and then re-engaged, thereby resulting in almost imperceptible effect on current flow to the load. It should also be pointed out that this alternative core functionality diagnostic check could also be beneficially used in embodiments of the SSCB 100 that do not include an air gap disconnect unit 108, in other words, in embodiments of the SSCB 100 that only include power semiconductors between the line-IN and line-OUT terminals 110 and 112 and that consequently rely solely on the power semiconductors to isolate the load in the event of a fault or overload.

Figure 9A:
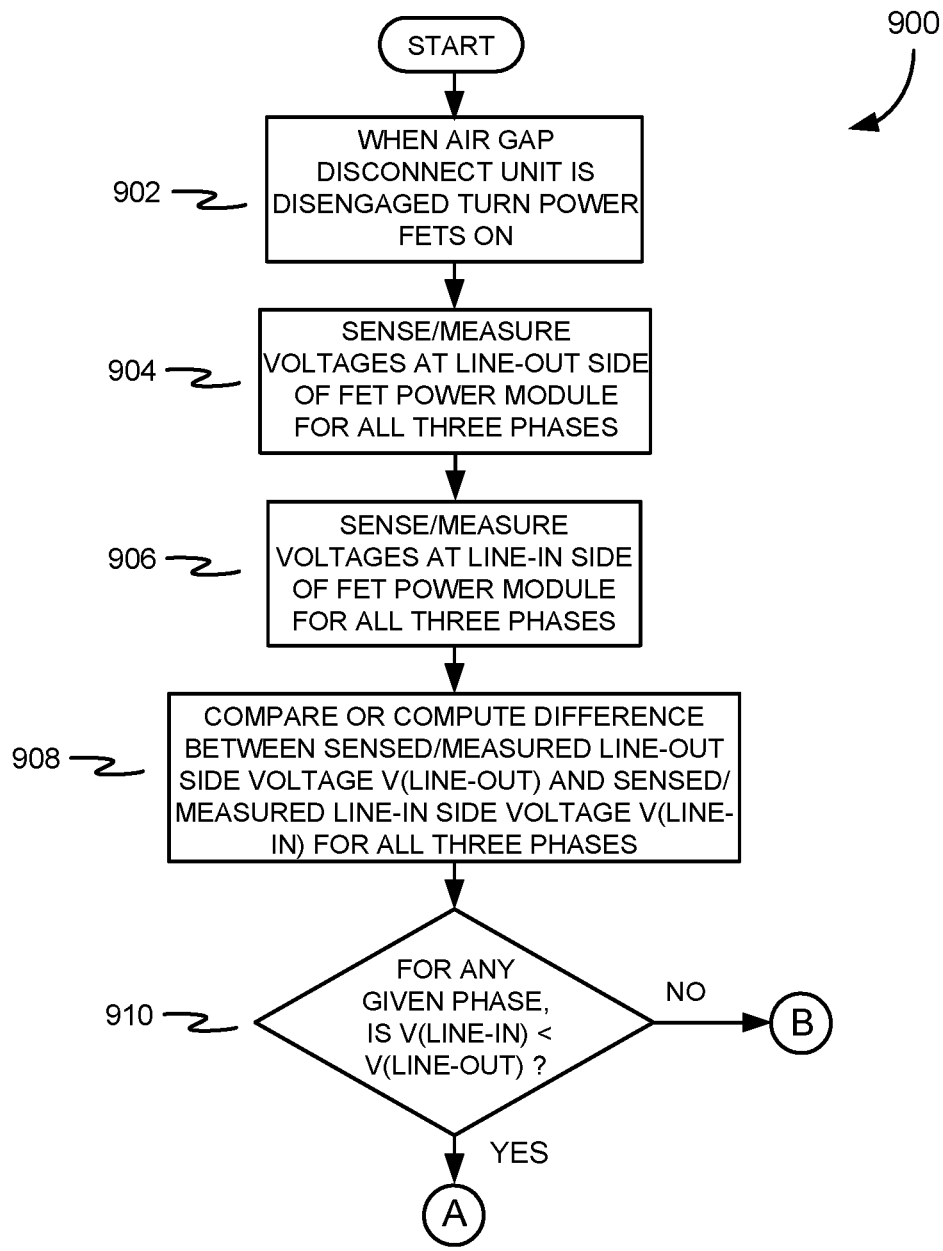
FIG. 9A is a portion of a flowchart illustrating a method the MCU of the SSCB performs to monitor and diagnose whether the air gap disconnect unit in the SSCB has failed closed, or has likely failed closed, and the actions the SSCB takes upon determining that the air gap disconnect unit has failed closed, or likely failed closed, according to one embodiment of the present invention.
Figure 9B:
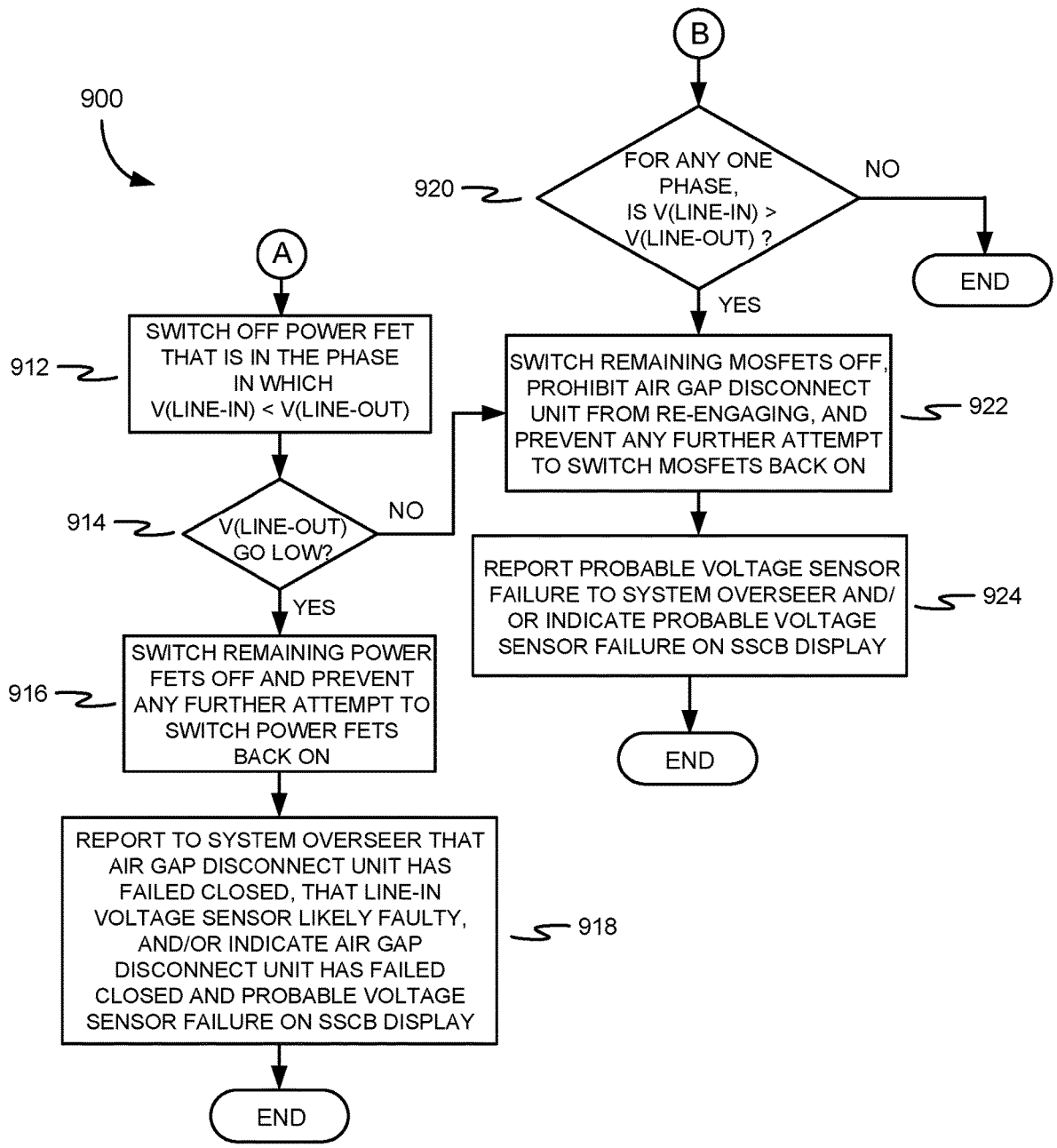
FIG. 9B is a portion of a flowchart illustrating a method the MCU of the SSCB performs to monitor and diagnose whether the air gap disconnect unit in the SSCB has failed closed, or has likely failed closed, and the actions the SSCB takes upon determining that the air gap disconnect unit has failed closed, or likely failed closed, according to one embodiment of the present invention.

FIG. 9 (FIGS. 9A and 9B inclusive) is a flowchart of a method 900 the MCU 102 performs (together with other cooperating components of the SSCB 100) to monitor and diagnose the vitality, efficacy, and operability of the air gap disconnect unit 108, specifically, to monitor and diagnose whether the air gap disconnect unit 108 has failed closed (perhaps due to one or more of the air gap contact switches 114 failing closed without any ability to reopen) and how the SSCB 100 responds after the MCU 102 determines that the air gap disconnect unit 108 has, in fact, failed closed. According to this method 900, the MCU 102 is also provided the ability to detect the possible failure of the Line-IN and/or Line-OUT current/voltage sensors 154 and 156. At step 902 the MCU 102 commands the air gap disconnect unit 108 to disengage and form an air gap (by generating a solenoid trigger signal to close switch 120, connect the air gap disconnect capacitor 117 across the coil of the solenoid 118, and open the air gap contact switches 114, as previously described) and after the air gap has formed commands the sense and drive circuit 104 to switch the power FETs 116 ON. At steps 904 and 906, the input and output voltages for all three phases are measured at both the Line-IN and Line-OUT sides of the FET power module 106. The sensed/measured Line-IN and Line-OUT voltages are directed to the MCU 102, and in step 908 the MCU 102 compares the Line-IN and Line-OUT voltages V(Line-IN) and V(Line-OUT) or computes the difference between them for each phase. Then, at decision 910, if the MCU 102 determines that for any given phase V(Line-IN)<V(Line-OUT) ("YES" at decision 910), the MCU 102 is able to properly conclude that either the air gap disconnect unit 108 has failed closed and/or that one or more of the Line-IN and Line-OUT current/voltage sensors 154 and 156 has/have failed. To eliminate the possibility that one or more of the Line-OUT current/voltage sensors 156 has/have failed, step 912 and decision 914 are performed. Specifically, at step 912 the MCU 102 directs the sense and drive circuit 104 to switch OFF the power FET 116 that is in the phase in which V(Line-IN)<V(Line-OUT) was determined. Then, the Line-OUT current/voltage sensor 156 measures V(Line-OUT) at the output of the power FET 116 that has just been switched OFF, and at decision 914 the MCU 102 determines whether V(Line-OUT) goes low. If V(Line-OUT) does go low, the MCU 102 is able to conclude that the air gap disconnect unit 108 has failed closed and that one more of the Line-IN current/voltage sensors 154 has/have likely failed. Since both are serious problems, at step 916 the MCU 102 directs the sense and drive circuit 104 to switch the remaining power FETs 116 OFF and prevents any further attempt to switch the power FETs 116 back ON, and at step 918 reports to the system overseer that the air gap disconnect unit 108 has failed closed and that one or more of the Line-IN current/voltage sensors 154 has also likely failed. The MCU 102 may also report the failure or likely failure to a remote computer, via the comm/control bus 124, and/or direct the SSCB's 100's display to display the failure information on its electronic display 113, as indicated by step 918.

If V(Line-OUT) does not go low at decision 814 ("NO" at decision 914), the MCU 102 is able to conclude that the air gap disconnect unit 108 has not failed closed but that one or more of the Line-OUT current/voltage sensors 156 has/have likely failed. Accordingly, at step 922 the MCU 102 directs the sense and drive circuit 104 to switch the remaining power FETs 116 OFF, prohibits the air gap disconnect unit 108 from re-engaging, and prevents any further attempt to switch the power FETs 116 back ON. In this state the SSCB 100 is locked down until it can be serviced/repaired by a qualified electrician or engineer. Finally, at step 924 the MCU 102 reports the probable failure of one or more of the Line-OUT current/voltage sensors 156 to the system overseer and/or directs the SSCB 100 to indicate on its electronic display 113 that one or more of the Line-OUT current/voltage sensors 156 has/have likely failed.

At decision 910 if the MCU 102 determines that V(Line-IN) is not less than V(Line-OUT) in any of the three phases ("NO" at decision 810), the MCU 102 is able to properly conclude that the air gap disconnect unit 108 has not failed closed and the Line-IN current/voltage sensors 154 are operating as intended. However, that determination does not by itself foreclose the possibility that one or more of the Line-OUT current/voltage sensors 156 has/have failed. To ensure that the Line-OUT current/voltage sensors 156 are working as intended, decision 920 is performed, specifically, querying whether for any given phase V(Line-IN)>V(Line-OUT). If for any given phase V(Line-IN)>V(Line-OUT) ("YES" at decision 920), the MCU 102 is able to properly conclude that although the air gap disconnect unit 108 has not failed closed and the Line-IN current/voltage sensors 154 are operating as intended, it is likely that one or more of the Line-OUT current/voltage sensors 156 has/have failed. Accordingly, step 922 is performed to lock down the SSCB 100, and, finally, at step 924 the MCU 102 reports the probable failure of one or more of the Line-OUT current/voltage sensors 156 to the system overseer and/or directs the SSCB 100 to indicate on its electronic display 113 that one or more of the Line-OUT current/voltage sensors 156 has/have likely failed.

Figure 10A:
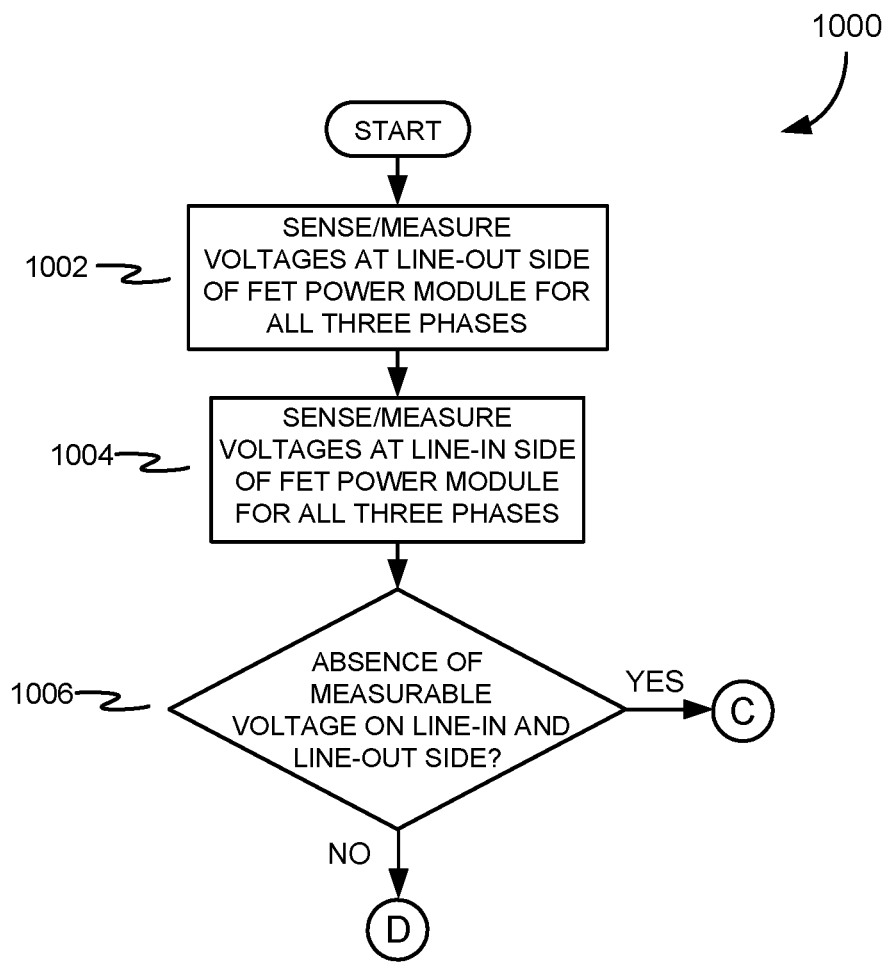
FIG. 10A is a portion of a flowchart illustrating a method the MCU of the SSCB performs to monitor and diagnose whether the air gap disconnect unit in the SSCB has failed open, or has likely failed open, and the actions the SSCB takes upon determining that the air gap disconnect unit has failed open, or likely failed open, according to one embodiment of the present invention.
Figure 10B:
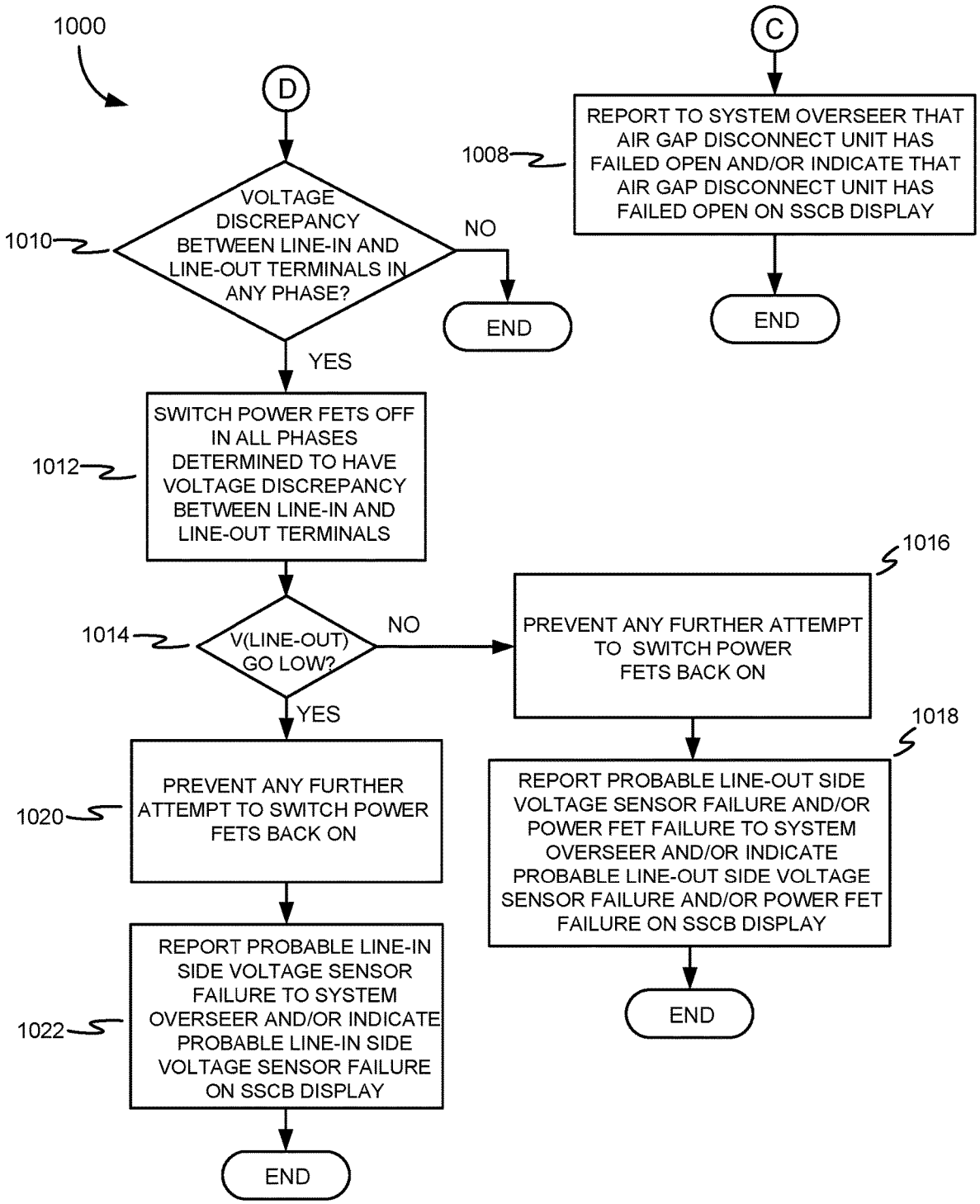
FIG. 10B is a portion of a flowchart illustrating a method the MCU of the SSCB performs to monitor and diagnose whether the air gap disconnect unit in the SSCB has failed open, or has likely failed open, and the actions the SSCB takes upon determining that the air gap disconnect unit has failed open, or likely failed open, according to one embodiment of the present invention.

In addition to being programmed to monitor and diagnose whether the air gap disconnect unit 108 has failed closed, in one embodiment of the invention the MCU 102 is programmed to also monitor and diagnose whether the air gap disconnect unit 108 has failed open. FIG. 10 (FIGS. 10A and 10B inclusive) is a flowchart of a method 1000 the MCU 102 performs in this regard (together with other cooperating components of the SSCB 100). Prior to the start of the method 1000, it is assumed that all of the power FETs 116 are ON and the air gap disconnect unit 108 is engaged (air gap contact switches 114 closed). Then, at steps 1002 and 1004 the input and output voltages for all three phases are measured at both the Line-IN and Line-OUT sides of the FET power module 106. At decision 1006, using the current/voltage measurements it receives from the Line-IN and Line-OUT current/voltage sensors 154 and 165, the MCU 102 determines whether in any given phase there is an absence of measurable voltage on both the Line-IN side and Line-OUT side of the FET power module 106. If there is ("YES" at decision 1006), the MCU 102 is able to conclude that one or more phases of the air gap disconnect unit 108 has/have failed open. Accordingly, at step 1008 the MCU 102 reports to the system overseer, over the comm/control bus 124, that one or more phases of the air gap disconnect unit 108 has/have failed open.

If the MCU 102 determines that for each of the three phases there is not an absence of measurable voltage on both the Line-IN and Line-OUT sides of the FET power module 106 ("NO" at decision 1006), it is still possible that one or more of the Line-IN and Line-OUT current/voltage sensors 154 and 156 has/have failed or is/are likely failing. To further ascertain and isolate any failed or likely failing Line-IN current/voltage sensors(s) 154 or failed or likely failing Line-OUT current/voltage sensors(s) 156, steps 1010-1022 are performed. Specifically, at decision 1010 the MCU 102 determines from Line-IN and Line-OUT voltage measurements taken by the Line-IN and Line-OUT current/voltage sensors 154 and 156 if there is a voltage discrepancy between the Line-IN and Line-OUT voltages in any of the three phases. If "NO," the MCU 102 is able to conclude that all of the Line-IN and Line-OUT voltage sensors 154 and 156 and the air gap disconnect unit 108 are all working properly and the method 1000 ends. On the other hand, if at decision 1010 the MCU 102 determines that there is a voltage discrepancy between the Line-IN and Line-OUT voltages in any of the three phases ("YES" at decision 1010), the MCU 102 is able to properly conclude that one or more of the voltage sensors 154 and/or 156 has/have failed or is/are likely failing. To determine whether the failed or failing voltage sensors in any failed phase is a Line-IN current/voltage sensor 154 or is a Line-OUT voltage sensor 156, at step 1012 the MCU 102 directs the sense and drive circuit 104 to switch OFF the power FETs 116 in each phase that it determined in decision 1010 that one or more of the voltage sensors 154 and/or 156 has/have failed or is/are likely failing, and at decision 1014 the MCU 102 then determines whether in each of these phases whether V(Line-OUT) goes low or stays high. If V(Line-OUT) does not go low in any of the phases ("NO" at decision 1014), the MCU 102 concludes that one or more of the Line-OUT voltage sensors 156 has/have failed or is/are likely failing and/or that one or more of the power FETs 116 has/have failed and, acting on that determination, in step 1016 prevents any further attempt to switch the power FETs 116 back ON. Then at step 1018 the MCU 102 reports to the system overseer that one or more of the Line-OUT voltage sensors 156 has/have failed or is/are likely failing and/or one or more of the power FETs 116 has/have failed, and/or directs the SSCB's 100's electronic display 113 to indicate that one or more of the Line-OUT voltage sensors 156 has/have failed or is/are likely failing and/or that one or more of the power FETs 116 has/have failed. If, on the other hand, the MCU 102 determines at decision 1014 that V(Line-OUT) goes low in all phases after the power FETs 116 are switched OFF at step 1012 ("YES" at decision 1014), the MCU 102 concludes that one or more of the Line-IN voltage sensors 154 has/have failed or is/are likely failing. Acting on that determination, at step 1020 the MCU 102 prevents any further attempt to switch the power FETs 116 back ON. Finally, at step 1022 the MCU 102 reports to the system overseer that one or more of the Line-IN current/voltage sensors 154 has/have failed or is/are likely failing and/or directs the SSCB's 100's electronic display 113 to indicate that one or more of the Line-IN voltage sensors 154 has/have failed or is/are likely failing.

Figure 11:
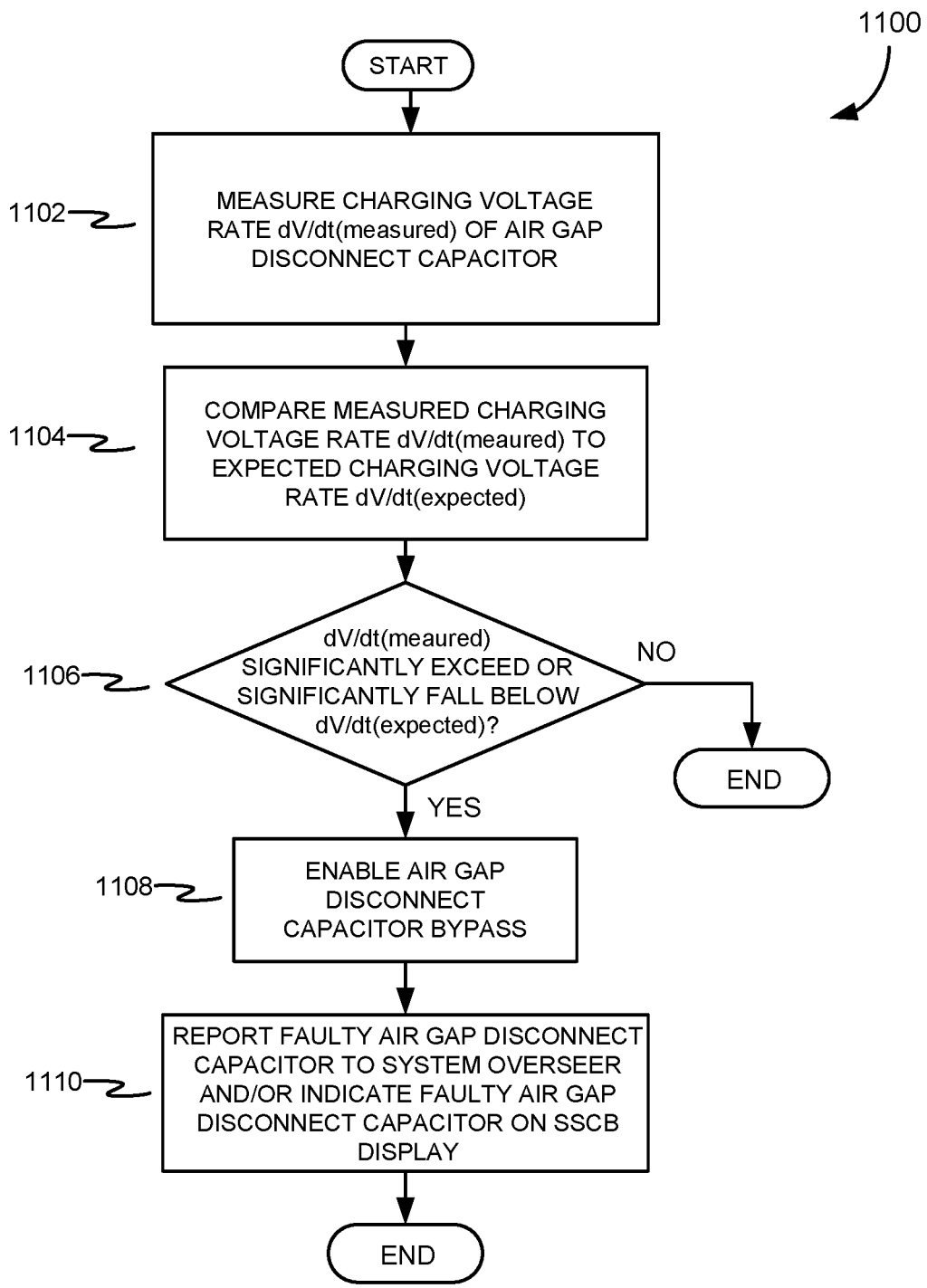
FIG. 11 is a flowchart illustrating a method the MCU of the SSCB performs to monitor and diagnose the vitality, efficacy, and operability of an air gap disconnect capacitor in the SSCB, and the actions the SSCB takes upon determining that the air gap disconnect capacitor has failed or is failing.

The solenoid 118 in the air gap disconnect unit 108 requires a significant amount of energy to drive the air gap disconnect unit 108 open. To avoid undesirable dips in the DC voltage VDC produced by the AC/DC converter 126 (which, as explained above, serves as the DC power supply for the DC electronics in the SSCB 100, including the MCU 102, CRM 103, and DC components on the sense and drive circuit 104), the large air gap disconnect capacitor 117 is used as an energy source to trigger the solenoid 118. (Note: In some embodiments of the invention the air gap disconnect capacitor 117 is also configured to serve as a backup DC power supply for a short duration, supplying a backup DC voltage VDC(backup), in the event of loss of the DC voltage VDC produced by the AC/DC converter 126.) In one embodiment of the invention, the MCU 102 is programmed to monitor and diagnose the vitality, efficacy, and operability of the air gap disconnect capacitor 117, and generate a capacitor bypass signal that allows the AC/DC converter 126 to bypass the air gap disconnect capacitor 117 upon determining that the air gap disconnect capacitor 117 has failed or is failing. FIG. 11 is a flowchart illustrating this method 1100. The method 1100 is performed as the air gap disconnect capacitor 117 charges, in particular, each time the SSCB 100 boots up and every time it is recharging after having been discharged due to firing the solenoid 118 in the air gap disconnect unit 108. During first step 1102, as the air gap disconnect capacitor 117 charges, the MCU 102 measures the charging voltage rate dV/dt(measured). At step 1104 the MCU 102 compares the measured charging rate dV/dt (measured) to an expected (predetermined) charging rate dV/dt(expected), and then at decision 1106 determines whether dV/dt(measured) significantly exceeds or significantly falls below the expected charging rate dV/dt(expected). If it does not ("NO" at decision 1106), the MCU 102 is able to conclude that the air gap disconnect capacitor 117 is operating properly and the method 1100 ends. On the other hand, if at decision 1106 the MCU 102 determines that the measured charging rate dV/dt(measured) is significantly greater than or significantly less than the expected charging rate dV/dt(expected) ("YES" at decision 1106), at step 1108 the MCU 102 concludes that the air gap disconnect capacitor 117 has failed or is likely failing and the MCU 102 generates and applies a cap bypass control signal that closes a cap bypass switch 123 (see FIG. 1) to bypass the air gap disconnect capacitor 117. In this bypass configuration the AC/DC power converter 127 is used to trigger the air gap disconnect unit 108. Since this is not a preferred configuration (it instead being preferred to use the energy stored in the air gap disconnect capacitor 117 to trigger the air gap disconnect unit solenoid 118), at step 1110 the MCU 102 reports to the system overseer that the air gap disconnect capacitor 117 has failed or is likely failing and needs to be replaced. Additionally (or alternatively), the MCU 102 can also direct the SSCB's 100's electronic display 113 to indicate that the air gap disconnect capacitor 117 has failed or is likely failing.

Figure 12:
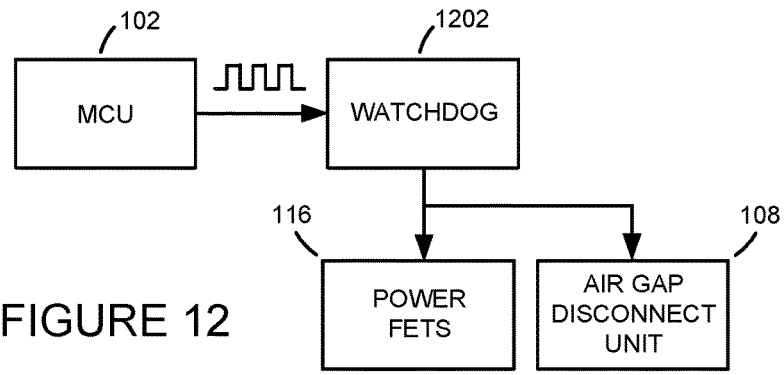
FIG. 12 is a block diagram illustrating how, in one embodiment of the SSCB, the SSCB's MCU is configured to generate a periodic heartbeat signal that an external watchdog circuit continuously monitors to confirm the vitality and operability of the MCU.

Because the MCU 102 is the 'brains' of the SSCB 100, it is important that it not fail, but in the unlikely event that it does fail it is preferable to have some way to trip the SSCB 102 without the required assistance of the MCU 102. To fulfill this goal, and as illustrated in FIG. 12, in one embodiment of the invention the MCU 102 is programmed to produce a periodic 'heartbeat' (e.g., a 10 kHz square wave) at one of its outputs. The heartbeat is fed to the input of an external 'watchdog' 1202, which produces an output signal that switches OFF the power FETs 116 (or that is used to direct the sense and drive circuit 104 to switch the power FETs 116 OFF). Additionally, the watchdog 1202 generates a solenoid trigger signal that triggers the air gap disconnect unit 108 to disengage (open air gap contact switches 114), similar to how the MCU 102 generates a solenoid trigger signal to trigger the air gap disconnect unit 108 to disengage when the MCU 102 is operating properly. Alternatively, the watchdog 1202 is configured to first attempt to reset the MCU 102, before switching the power FETs 116 OFF and before triggering the air gap disconnect unit 108. The watchdog 1202 can be constructed in various ways. In one embodiment of the invention it comprises a counter and a flip-flop, which together monitor the MCU's 102's heartbeat and generate disable signals to switch OFF the power FETs 116 and disengage the air gap disconnect unit 108 when the heartbeat flatlines or becomes erratic or aperiodic.

Figure 13:
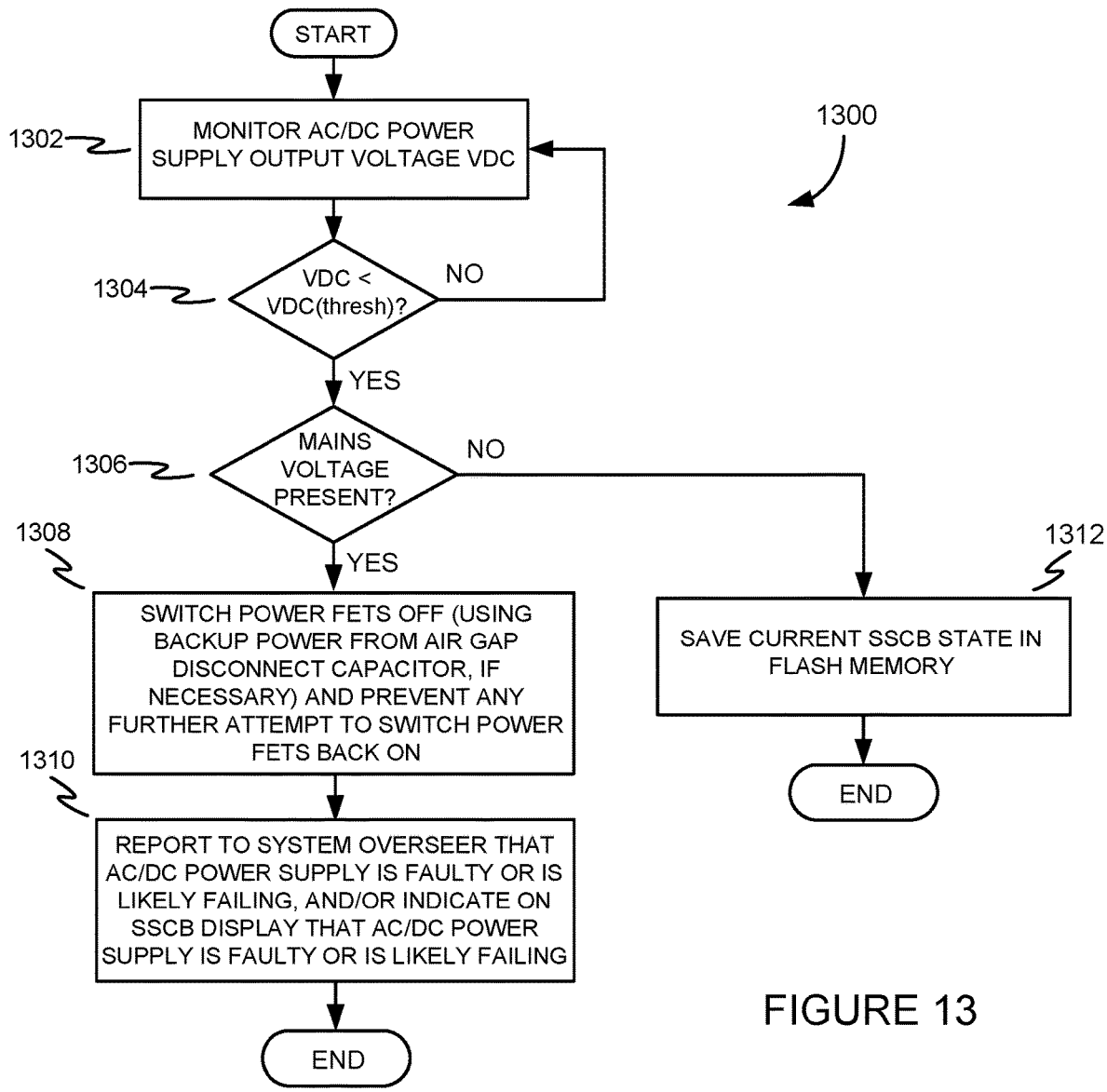
FIG. 13 is a flowchart illustrating a method the MCU of the SSCB performs to monitor the vitality, efficacy, and operability of the SSCB's AC/DC converter, which serves as the primary DC power supply for the MCU and other DC-powered electronics within the SSCB, and the actions the SSCB takes upon determining that the AC/DC converter has failed, or is likely failing, in accordance with one embodiment of the present invention.

In the exemplary embodiment of the SSCB 100 described herein the AC/DC converter 126 (see FIG. 1) serves as the primary DC power supply for the MCU 102, CRM 103, sense and drive circuit 104, and other DC-powered electronics within the SSCB 100. In one embodiment of the invention the AC input power to the AC/DC converter 126 is AC mains power supplied by the AC mains. Consequently, it is important to monitor the presence of the AC mains power and the vitality and operability of the AC/DC converter 126, to ensure the SSCB's 100's intended and proper operation, and to take appropriate measures in the event that the AC input power is lost and/or the AC/DC power converter 126 fails. In one embodiment of the invention the presence of AC input power is continually monitored and the vitality, efficacy, and operability of the AC/DC converter 126 is also monitored. If the AC input power is determined to be not present and/or the AC/DC converter 126 is determined to have failed or determined to be likely failing, the MCU 102 directs the sense and drive circuit 104 to switch the power FETs 116 OFF (using energy stored in the air gap disconnect capacitor 117, if necessary). FIG. 13 is a flowchart further illustrating this method 1300. While monitoring the AC/DC converter's 126's DC output voltage VDC in step 1302, at decision 1304 the MCU 102 determines whether VDC is less than some predetermined low DC threshold VDC(threshold), i.e., determines whether VDC<VDC(threshold). If the MCU 102 determines that VDC has dropped below the threshold VDC(threshold) ("YES" at decision 1304) and that VDC has remained below the threshold for longer than some predetermined duration of time and at decision 1306 the MCU 102 also determines that AC power is present at the input of the AC/DC converter 126, the MCU 102 is able to properly conclude that the AC/DC converter 126 has failed or is likely failing. Accordingly, at step 1312 the MCU 102: directs the sense and drive circuit 104 to switch the power FETs 116 OFF, generates a solenoid trigger signal that causes the air gap disconnect unit 108 to disengage and open air gap contact switches 114, and prevents any further attempts to switch the power FETs 116 back ON and re-engage the air gap disconnect unit 108, until an electrician or engineer can be dispatched to replace the SSCB 100 or remove the failed or failing AC/DC converter 126 and replace it with one that is functional. If at decision 1306 the MCU 102 determines that AC power is not present at the input of the AC/DC converter 126, the MCU 102 cannot conclude that VDC has dropped below the threshold VDC(threshold) due to a failed or failing AC/DC converter 126. So that the SSCB 100 can resume its normal operation in the event that the AC power is restored, in step 1312 the current state of the SSCB 100 may be stored in the flash memory portion of the SSCB 100's CRM 103.

Figure 14:
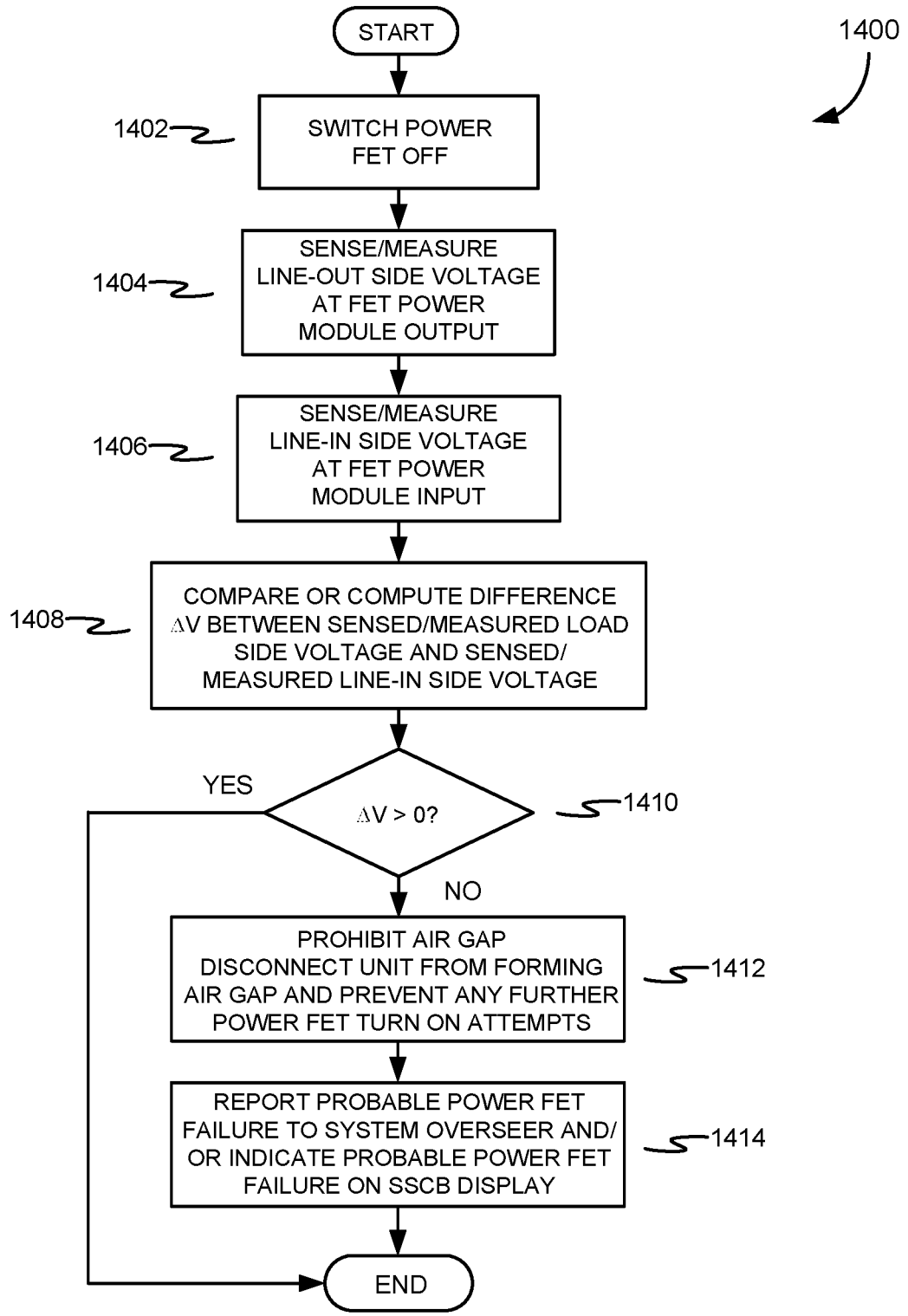
FIG. 14 is a flowchart illustrating a method the MCU of the SSCB performs to monitor the vitality, efficacy, and operability of the power field-effect transistors (FETs) of a FET power module in the SSCB, and the actions the MCU takes upon determining that one or more of the power FETs has/have failed, has/have likely failed, or is/are failing, in accordance with one embodiment of the present invention.

The air gap disconnect unit 108 is designed to galvanically isolate the load upon the SSCB 100 detecting a fault or overload of unacceptably long duration. To prevent arcing across the air gap, it is preferable to switch the power FETs 116 OFF before the air gap disconnect unit 108 completes forming the air gap between the Line-IN and Line-OUT terminals 110 and 112. To accomplish this safeguard, in one embodiment of the invention the MCU 102 is programmed to continuously monitor the vitality, efficacy, and operability of the power FETs 116. Then, upon determining that one or more of the power FETs 116 has failed (or is/are likely failing), the MCU 102 is prohibited from generating the solenoid trigger signal that triggers the air gap disconnect unit 108 to open the air gap contact switches 114. FIG. 14 is a flowchart illustrating this method 1400 in more detail. First, at step 1402 the power FETs 116 in the FET power module are switched OFF. Then, at steps 1404 and 1406 the current/voltage sensors 154 and 156 sense/measure the voltages for each phase at both the Line-IN and Line-OUT sides of the FET power module 106. Using the measured voltages, at step 1408 the MCU 102 then determines whether there is a voltage drop ΔV across the drain-source terminals of any one of the power FETs 116. Since the power FETs 116 were switched OFF in step 1402, a voltage ΔV should be present. If a voltage ΔV is determined to be present ("YES" at decision 1410), the MCU 102 is able to properly conclude that the power FETs 116 are in fact switched OFF and operating as intended, and the method 1400 ends. However, if the MCU 102 determines that a voltage drop ΔV does not appear across any one of the drain-source terminals of any one of the power FETs 116 or only a very small voltage drop ΔV appears ("NO" at decision 1410), the MCU 102 is able to conclude that one or more of the power FETs 116 has failed closed (or has likely failed closed or is failing closed). Acting on this determination at step 1412 the MCU 102 then prevents the air gap disconnect unit 108 from disengaging (so no possibility of arcing can occur between the Line-IN and Line-OUT terminals 110 and 112) and prevents any further attempt to switch the power FETs 116 back ON. Finally, at step 1414 the MCU 102 reports to the system overseer that one or more of the power FETs 116 has failed (or has likely failed or is failing) and/or directs the SSCB's 100's electronic display to indicate that one or more of the power FETs 116 has failed (or has likely failed or is failing).

Figure 15:
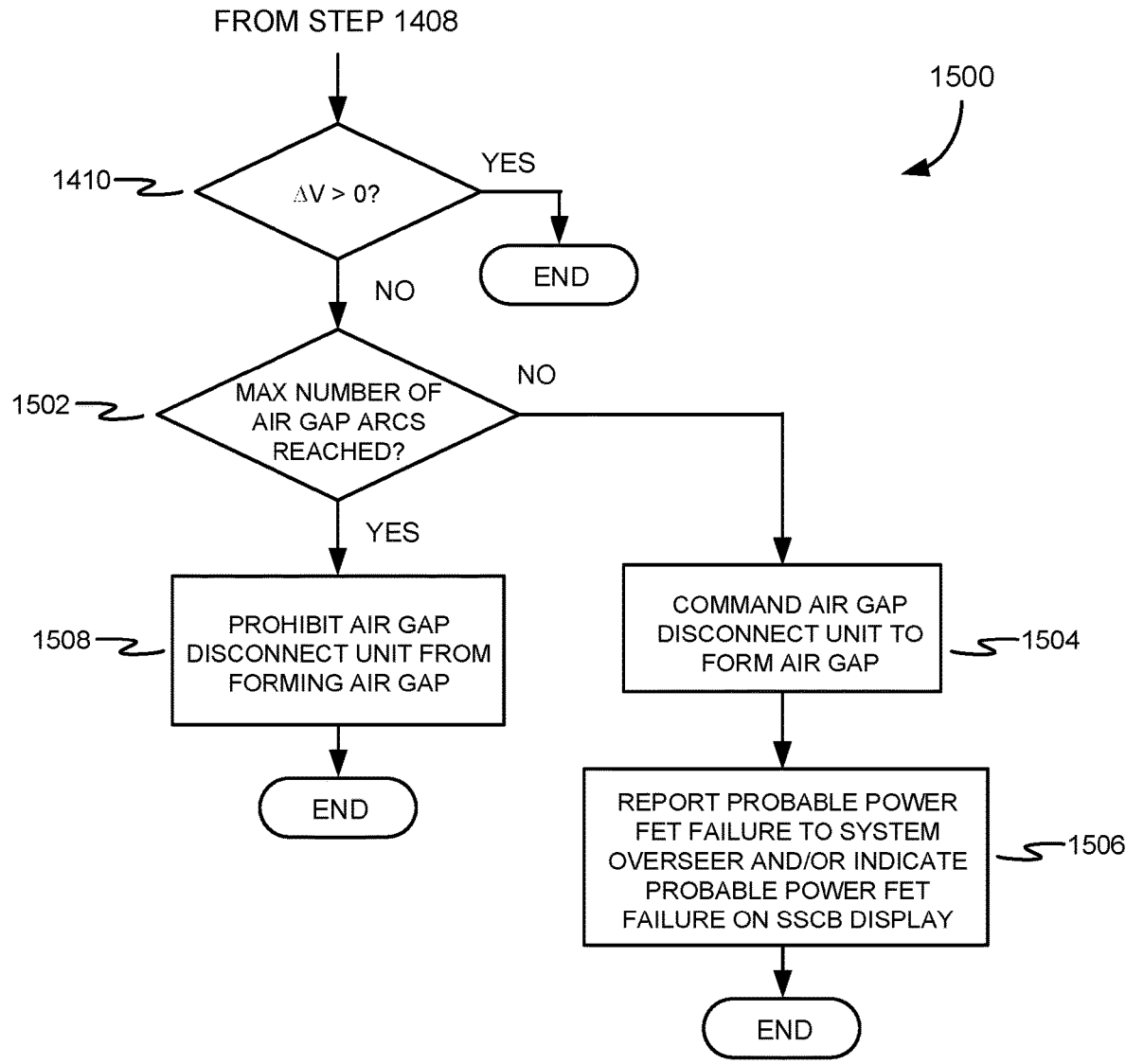
FIG. 15 is flowchart illustrating a method the MCU of the SSCB performs to monitor the vitality, efficacy, and operability of the power FETs of the SSCB's FET power module, and the actions the MCU takes upon determining that one or more of the power FETs has/have failed, has/have likely failed, or is/are failing, in accordance with one embodiment of the present invention.

Alternative to the method 1400 depicted in FIG. 14, after determining that ΔV is equal to or slightly greater than zero at decision 1410, the MCU 102 is programmed to command the air gap disconnect unit 108 to trigger and form the air gap, but only if the air gap disconnect unit 108 has not already exceeded some predetermined maximum number of air gap arc exposures. In this way, in the event that one or more of the power FETS 116 has/have failed closed and so long as the maximum number of air gap arc exposures has not been reached, an air gap can be beneficially formed between the Line-IN and Line-OUT terminals 110 and 112 to galvanically isolate the load. FIG. 15 is a flowchart illustrating this alternative method 1500. First, after determining that ΔV is not greater than zero at decision 1410, at decision 1502 the MCU 102 determines whether the predetermined maximum number of air gap arcs has been reached. If not ("NO" at decision 1502), at step 1504 the MCU 102 commands the air gap disconnect unit 108 to form an air gap between the Line-IN and Line-OUT terminals 110 and 112, despite the fact that one or more of the power FETs 116 may have failed closed and even though an arc might possibly occur between the Line-IN and Line-OUT terminals 110 and 112. Then at step 1506 the MCU 102 reports the probable power FET failure to the system overseer and/or directs the SSCB's 100's electronic display 113 to indicate that one or more of the power FETs 116 has/have failed or likely failed. On the other hand, if the MCU 102 determines at decision 1502 that the predetermined maximum number of air gap arcs has been reached ("YES" at decision 1502), at step 1508 the MCU 102 triggers the mechanical lock out mechanism 160 to ensure that the air gap disconnect unit 108 cannot be re-engaged.

Figure 16:
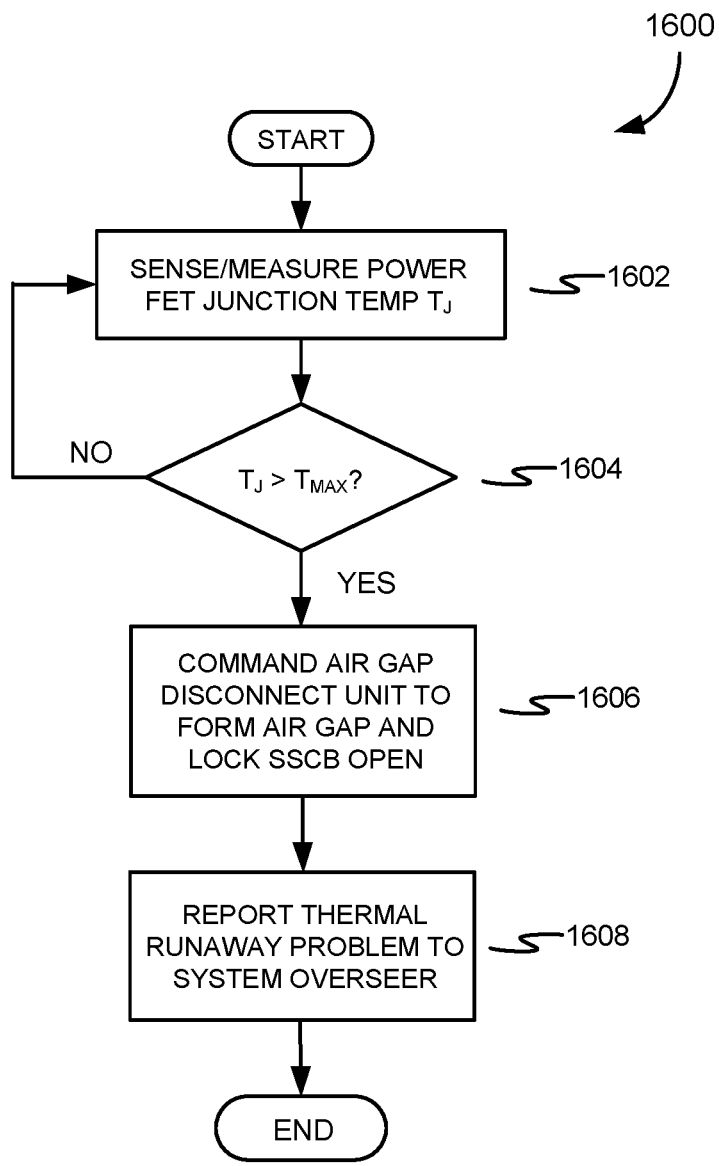
FIG. 16 is a flowchart illustrating a method the MCU of the SSCB performs in response to sensed/measured power FET junction temperatures sensed/measured by thermistors mounted in the SSCB's FET power module, and what actions the MCU takes upon determining that the junction temperature $T_J$ of one or more of the FETs in the FET power module exceeds a predetermined maximum permissible junction temperature $T_{MAX}$, in accordance with one embodiment of the present invention.

In a preferred embodiment of the SSCB 100, positive temperature coefficient (PTC) thermistors 152 (see FIG. 1) are mounted in the FET power module 106 as near as possible to each of the power FETs 116. The thermistors 152 are configured to measure and report the real-time operating temperature of the power FETs 116, and the MCU 102 is configured to receive and respond to the temperature measurements according to the method 1600 depicted in FIG. 16. Specifically, in response to the sensed/measured power FET junction temperatures sensed/measured by the thermistors 152 and reported to the MCU 102 (step 1602), at step 1604 the MCU 102 determines whether the sensed/measured junction temperature $T_J$ of any one of the power FETs 116 is greater than a predetermined maximum permissible junction temperature $T_{MAX}$, i.e., whether $T_J > T_{MAX}$. If not ("NO" at decision 1604) the method 1600 loops back to step 1602. However, if the MCU 102 determines that the sensed/measured junction temperature $T_J$ of any one of the power FETs 116 is greater than the predetermined maximum permissible junction temperature $T_{MAX}$ ("YES" at decision 1604), the MCU 102 is able to conclude that a possible thermal runaway condition is developing in one or more of the power FETs 116. To prevent damage to the power FET(s) 116 and/or possibly other components in the SSCB 100, at step 1606 the MCU 102 commands the air gap disconnect unit 108 to disengage to interrupt current flow through the power FETs 116, and at step 1608 the MCU 102 reports to the system overseer that a thermal runaway condition has likely occurred and/or directs the SSCB's 100's electronic display 113 to indicate that a probable thermal runaway condition has likely occurred. Additionally (or alternatively), the MCU 102 may also direct the sense and drive circuit 104 to switch the power FETs 116 OFF.

Figure 17:
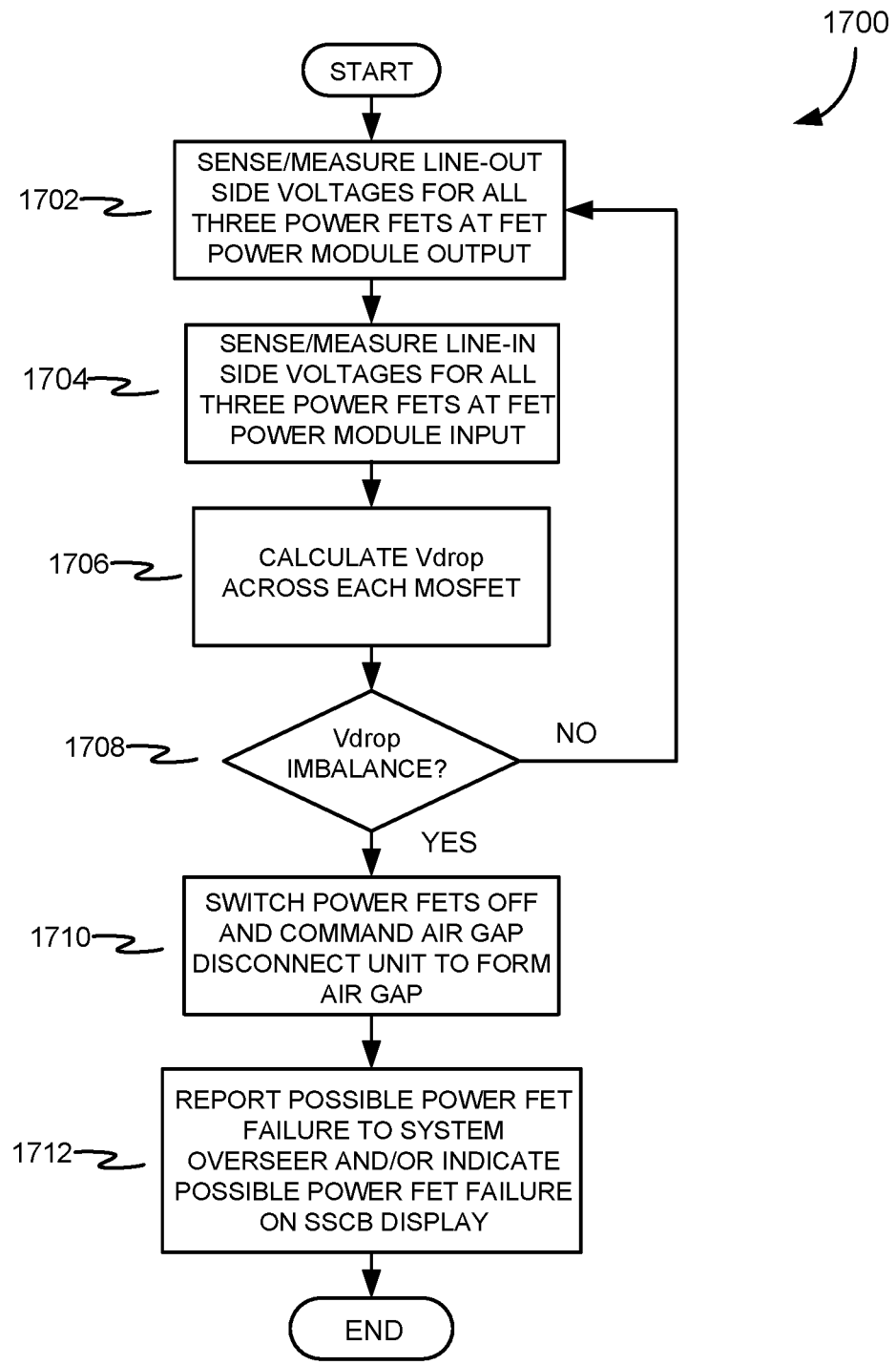
FIG. 17 is a flowchart illustrating a method the MCU of the SSCB performs to detect the failure or likely failure of one or more of the power FETs in the FET power module, and the actions the MCU takes upon determining that one or more of the power FETs has/have failed, according to one embodiment of the present invention.

In the exemplary embodiment of the SSCB 100 disclosed herein, Line-IN and Line-OUT current and voltage (current/voltage) sensors (e.g., Hall effect sensors) 154 and 156 are configured near or at the inputs and outputs of the FET power module 116. These measurements allow the MCU 102 to determine whether any one of the power FETs 116 has failed closed (as described above). In one embodiment of the invention, the MCU 102 is programmed to further determine that one or more of the power FETs 116 has failed (or is likely failing) by determining whether there is an imbalance of Vdrop across one power FET compared to the others. Under normal operating conditions, the RMS value of the line voltages should be substantially the same, so at any given time the RMS value of Vdrop across all three power FETs 116 should also be substantially the same. Any significant imbalance in Vdrop among the three phases provides an indication that one or more of the power FETs 116 has failed or is possibly failing. FIG. 17 is a flowchart highlighting a method 1700 the MCU 102 performs to detect such an imbalance and the steps it takes when an imbalance in Vdrop is determined to be present. First, with all power FETs 116 ON, at steps 1702 and 1704 the Line-IN and Line-OUT current/voltage sensors sense/measure and report the Line-IN and Line-OUT voltages present at the input and output of the FET power module 106 for all three power FETs 116. Next, using the sensed/measure voltages, at step 1706 the MCU 102 calculates Vdrop across each power FET 116. At decision 1708 if the values of Vdrop are the same for all three power FETs 116 ("NO" at decision 1708), the method 1700 returns to step 1702. However, if the MCU 102 determines that there is a significant imbalance of Vdrop in one power FET 116 compared to the others ("YES" at decision 1708), the MCU 102 is able to conclude that one or more of the power FETs 116 has failed or is likely failing. Accordingly, at step 1710 the MCU 102 directs the sense and drive circuit 104 to switch the power FETs 116 OFF and commands the air gap disconnect unit 108 to form an air gap between the Line-IN and Line-OUT terminals 110 and 112. Then, in step 1712 the MCU 102 reports to the overseer that one or more of the power FETs 116 has failed is likely failing and/or directs the SSCB's 100's electronic display 113 to indicate that one more of the power FETs 116 has failed or is likely failing.

Figure 18:
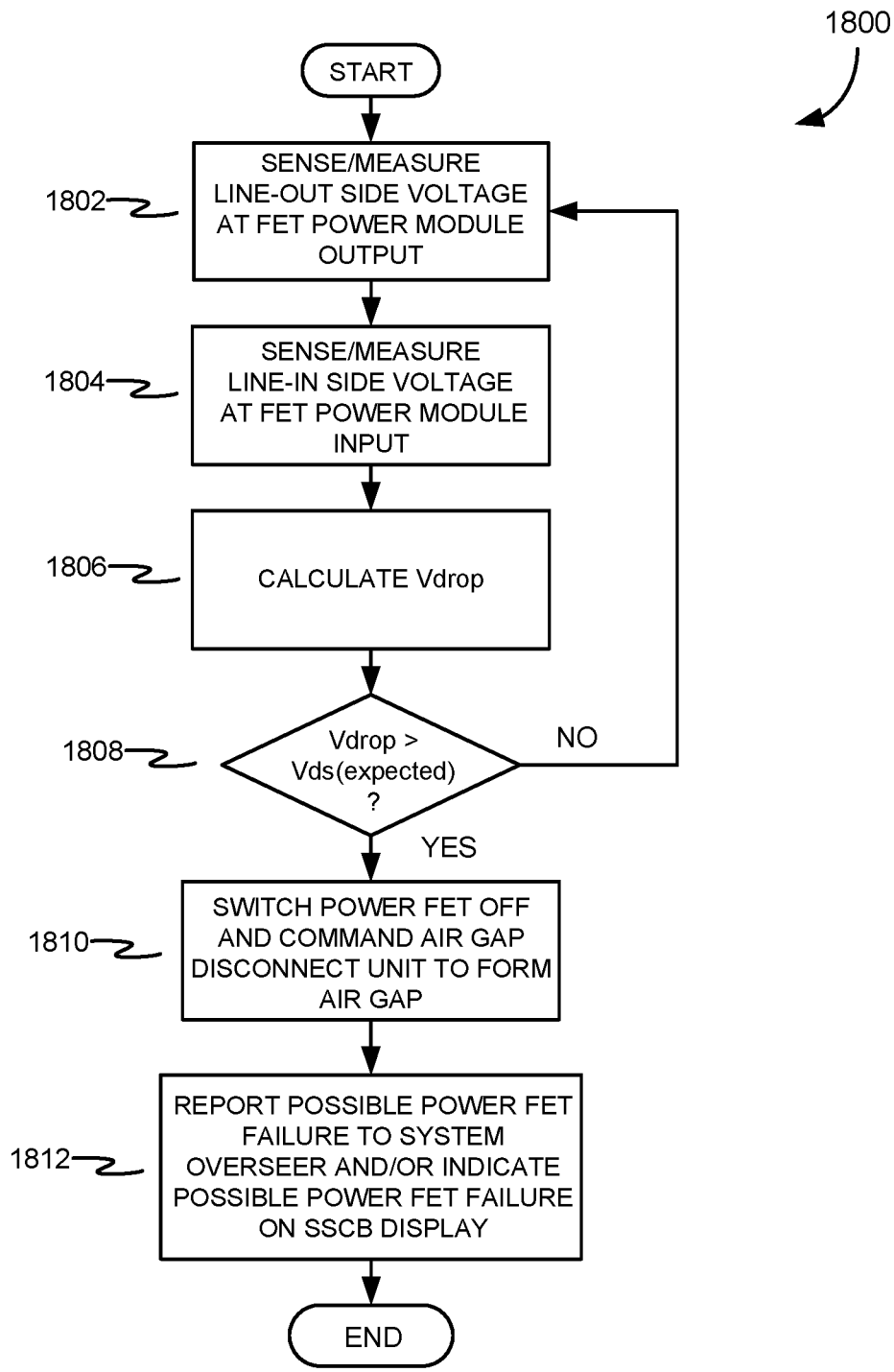
FIG. 18 is a flowchart illustrating a method the MCU of a single-phase version of the SSCB performs to detect the failure or likely failure of the SSCB's power FET, and the actions the MCU takes upon determining that the power FET has failed, has likely failed, or is likely failing, according to one embodiment of the present invention.

In the method 1700 just described in reference to FIG. 17, the MCU 102 is programmed so that it is able to determine that one or more of the power FETs 116 has/have failed (or is/are likely failing) when it determines there is an imbalance of Vdrop among the three power FETs 116. In a single-phase version of the SSCB 100, where just a single power FET is employed, the MCU 102 is programmed to calculate Vdrop (again from real-time Line-IN and Line-OUT voltage measurements but across just a single power FET) and determine based on Vdrop whether the single power FET has failed. This method 1800 is depicted in the flowchart presented in FIG. 18. First, at steps 1802 and 1804 current/voltage sensors on both the Line-IN and Line-OUT side of the power FET 116 are sensed/measured and reported to the MCU 102. At step 1806 the MCU 102 then computes Vdrop across the single power FET 116, and at decision 1808, based on measured current flowing through the single power FET 116 and the power FET's known operating characteristics (e.g., as obtained from a characterization of the power FET during design of the SSCB 100 and/or from operating characteristics provided by the power FET manufacturer) determines whether Vdrop>Vds(expected). If Vdrop is close to Vds(expected), the method 1800 returns to step 1802. However, if the MCU 102 determines that Vdrop is significantly different from Vds(expected) at decision 1708, the MCU 102 is able to properly conclude that the single power FET 116 has failed or is likely failing. Accordingly, at step 1810 the MCU 102 directs the sense and drive circuit 104 to switch the power FET 116 OFF and/or command the air gap disconnect unit 108 to disengage and form an air gap between the Line-IN and Line-OUT terminals. Finally, at step 1812 the MCU 102 alerts the system overseer that the power FET 116 has failed or is likely failing, so that an electrician or engineer can then be dispatched on site to replace the SSCB 100 with a new SSCB or remove the defective power module 106 and replace it with a new power module 106 with a properly functioning power FET 116. Additionally (or alternatively), the MCU 102 can direct the SSCB's 100's electronic display to indicate that the power FET 116 has failed or is likely failing.

Figure 19:
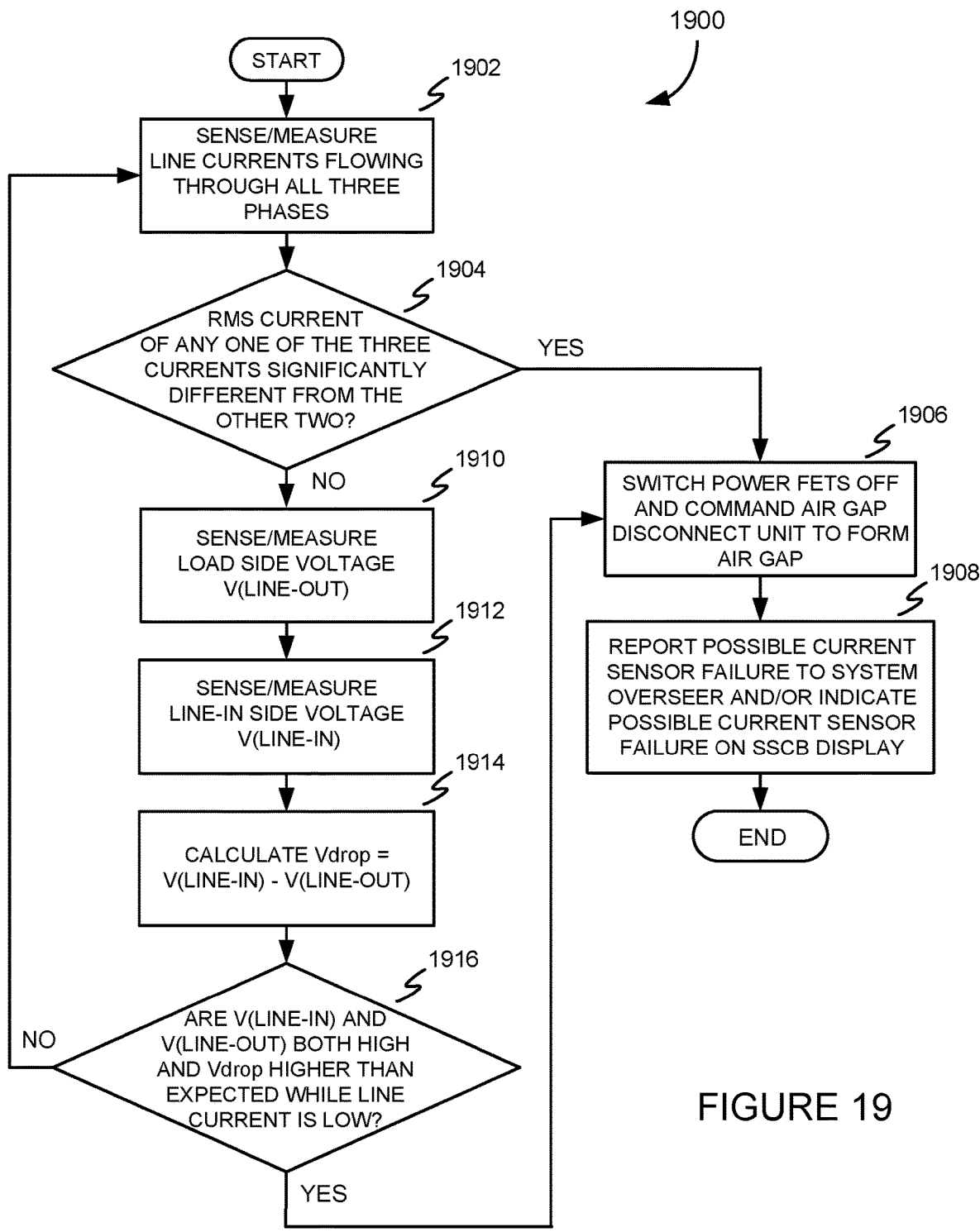
FIG. 19 is a flowchart illustrating a method the MCU of the SSCB performs to monitor the performance and diagnose any failure of line-OUT Hall effect sensors in the SSCB, and what actions the MCU takes upon determining that one or more of the Hall effect sensors has failed, has failed, or is likely failing, according to one embodiment of the present invention.

In a preferred embodiment of the SSCB 100 the Line-OUT current/voltage sensors 156 include Hall effect sensors that produce Hall voltages proportional to the magnetic fields formed around each of the Line-OUT conductors due to current flowing through the conductors. Because the magnetic field strengths are directly proportional to the magnitudes of the currents flowing through the Line-OUT conductors, the Hall voltages are representative of the magnitudes of the currents flowing the SSCB 100 when the power FETs 116 are switched ON and the air gap disconnect unit 108 is engaged (air gap contact switches 114 closed). Because accurate Hall effect measurements are vital to the proper operation of the SSCB 100, in one embodiment of the invention the MCU 102 is programmed to monitor the performance and diagnose any current sense failure. An exemplary method 1900 the SSCB 100 and MCU 102 perform in this regard is presented in FIG. 19. First, with all power FETs 116 ON and the air gap disconnect unit 108 engaged, at step 1902 the Hall effect sensors in the Line-OUT current/voltage sensors 156 sense/measure the line currents flowing out of the Line-OUT terminals 112. Preferably, the Hall effect measurements (Hall voltages) are performed in real time, amplified if necessary, and reported to the MCU 102. At decision 1904 the MCU 102 determines, based on the Hall voltages, whether the RMS of any one of the three sensed/measured currents is significantly different from the other two. If "YES", the MCU 102 is able to conclude that one of the Hall effect sensors has failed or failing, so at step 1906 directs the sense and drive circuit 104 to switch the power FETs 116 OFF and/or generates a solenoid trigger signal for the air gap disconnect unit 108 to trigger the air gap disconnect unit 108 to disengage and form an air gap between the Line-IN and Line-OUT terminals 110 and 112. Then, at step 1908 the MCU 102 reports the current sensor failure the system overseer and/or causes the SSCB's 100's electronic display 113 to indicate that one or more of the current sensors has failed or is likely failing. If at decision 1904 the MCU 102 determines that the three sensed/measured currents are balanced (RMS of all three sensed/measured currents substantially the same) ("NO" at decision 1904), that determination does not completely eliminate the possibility that one or more of the Line-IN and/or Line-OUT current/voltage sensors 154 and 156 has failed or may be possibly failing, so steps 1910 through 1914 and decision 1916 are performed. Specifically, at steps 1910 and 1912 the Line-IN and Line-OUT voltages are measured for all three phases at the inputs and outputs of the FET power module 106. At step 1914 the MCU 102 then calculates Vdrop=V(Line-IN)−V(Line-OUT) for all three phases. Finally, at decision 1916 if the MCU 102 determines that for any given phase V(Line-IN) and V(Line-OUT) are both high and Vdrop is higher than expected while the current is low ("YES" at decision 1916), the MCU 102 is able to conclude that one or more of the Line-IN and/or Line-OUT current/voltage sensors 154 and 156 has failed or is likely failing and steps 1906 and 1908 are performed. Otherwise ("NO" at decision 1916) the method returns to step 1902.

Figure 20:
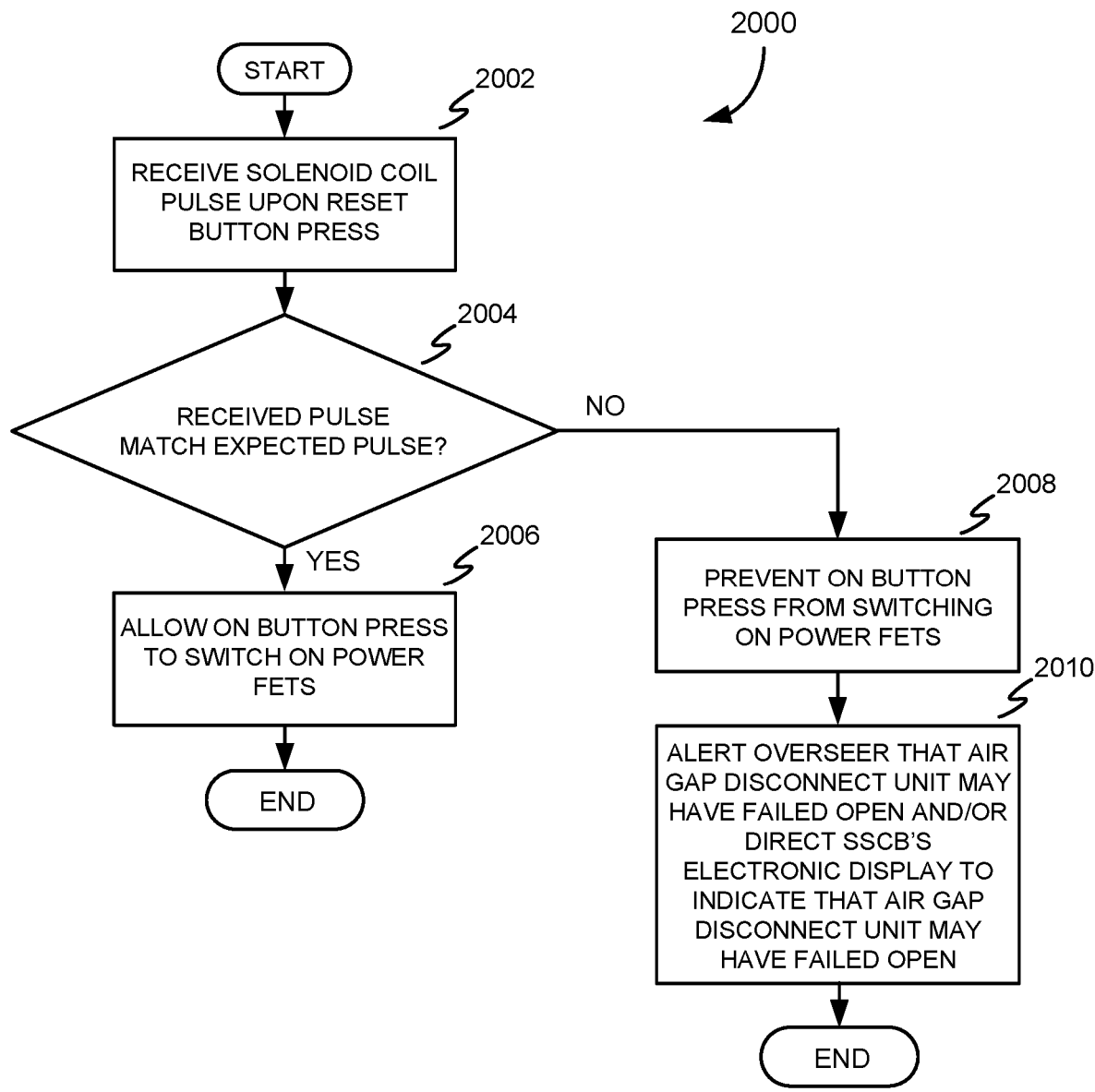
FIG. 20 is a flowchart illustrating a method the MCU of the SSCB performs to verify that the SSCB's air gap disconnect unit has successfully reengaged in response to a person pressing the SSCB's RESET button, and what actions the MCU takes upon determining that the air gap disconnect unit has failed to successfully reengage, according to one embodiment of the present invention.

The exemplary embodiment of the SSCB 100 described herein includes a RESET button 144 that a person can press to manually re-engage the air gap disconnect unit 108 and close the air gap between the Line-IN and Line-OUT terminals 110 and 112. After the RESET button 144 is pressed and the air gap contact switches 104 are closed, the person can then press the green ON button 107 to switch the power FETs 116 ON and thereby place the SSCB 100 in a fully ON state. If for any reason pressing the RESET button 144 does not successfully re-engage the air gap disconnect unit 108 and a person then presses the ON button 107 to switch the power FETs 116 ON, undesirable arcing can occur across one or more of the air gap disconnect switches 114 when the mechanism is released. To avoid this problem, in one embodiment of the invention the MCU 102 and other cooperating components of the SSCB 100 are configured to perform an air gap engagement verification method 2000, an exemplary embodiment of which is depicted in FIG. 20. This air gap engagement verification method 2000 operates based on the fact that whenever a person presses the RESET button 144 to engage the air gap disconnect unit 108, the motion of the solenoid's plunger 128 causes a small electrical pulse to be generated in the solenoid's 118's coil as the plunger 128 is pushed out of the solenoid's housing to latch and re-engage the air gap disconnect unit 108. The presence and shape of this pulse is used by the MCU 102 in the air gap engagement verification method 2000 to verify that the air gap disconnect unit 108 has in fact properly engaged. Specifically, at step 2002, upon the RESET button 144 being pressed, the pulse that appears at the terminals of the solenoid's 118's coil is amplified, filtered and directed to an input of the MCU 102. Next, at decision 2004 the received pulse is compared by the MCU 102 to an expected pulse. If the received pulse matches the expected pulse ("YES" at decision 2004), the MCU 102 is able to conclude that the air gap disconnect unit 108 has properly engaged and, as a result, allows the ON button 107 to be pressed to switch the power FETS 116 ON. On the other hand, if the received pulse does not match the expected pulse (or if no pulse is received by the MCU 102 when the RESET button 144 is pressed) ("NO" at decision 2004), at step 2008 the MCU 102 prevents any pressing of the ON button 107 to switch the power FETS 116 ON. In this way, arcing is prevented from occurring across the air gap contact switches 114 if the power FETs 116 were otherwise allowed to be switched ON. Finally, at step 2010 the MCU 102 reports to the system overseer that the air gap disconnect unit 108 has likely failed open and/or directs the SSCB's 100's electronic display 113 to indicate that the air gap disconnect unit 108 has likely failed open.

Figure 21:
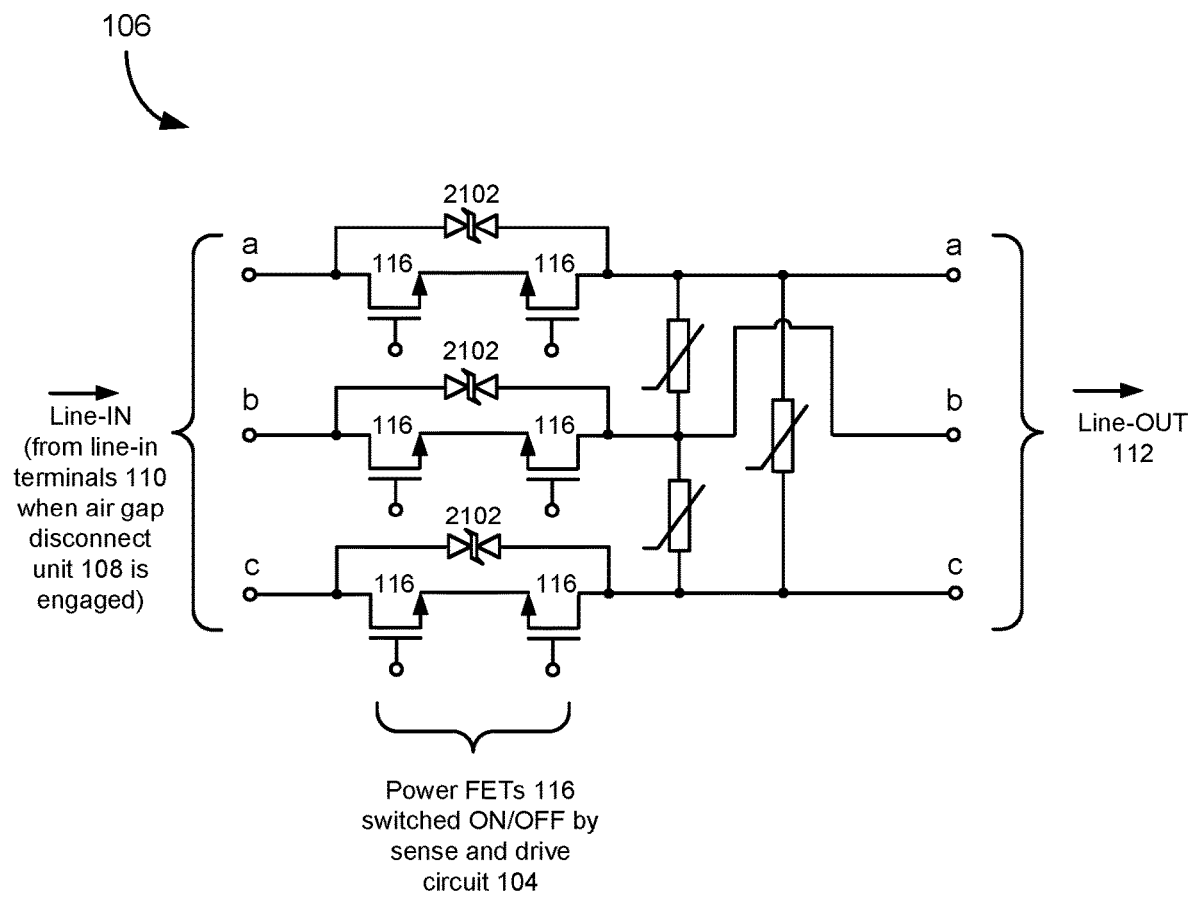
FIG. 21 is a schematic drawing of the salient components of the FET power module of the SSCB, according to one embodiment of the present invention, highlighting the connectivity of the power FETs and placement of various surge protection devices (SPDs) in the FET power module, in accordance with one embodiment of the present invention.
Figure 22:
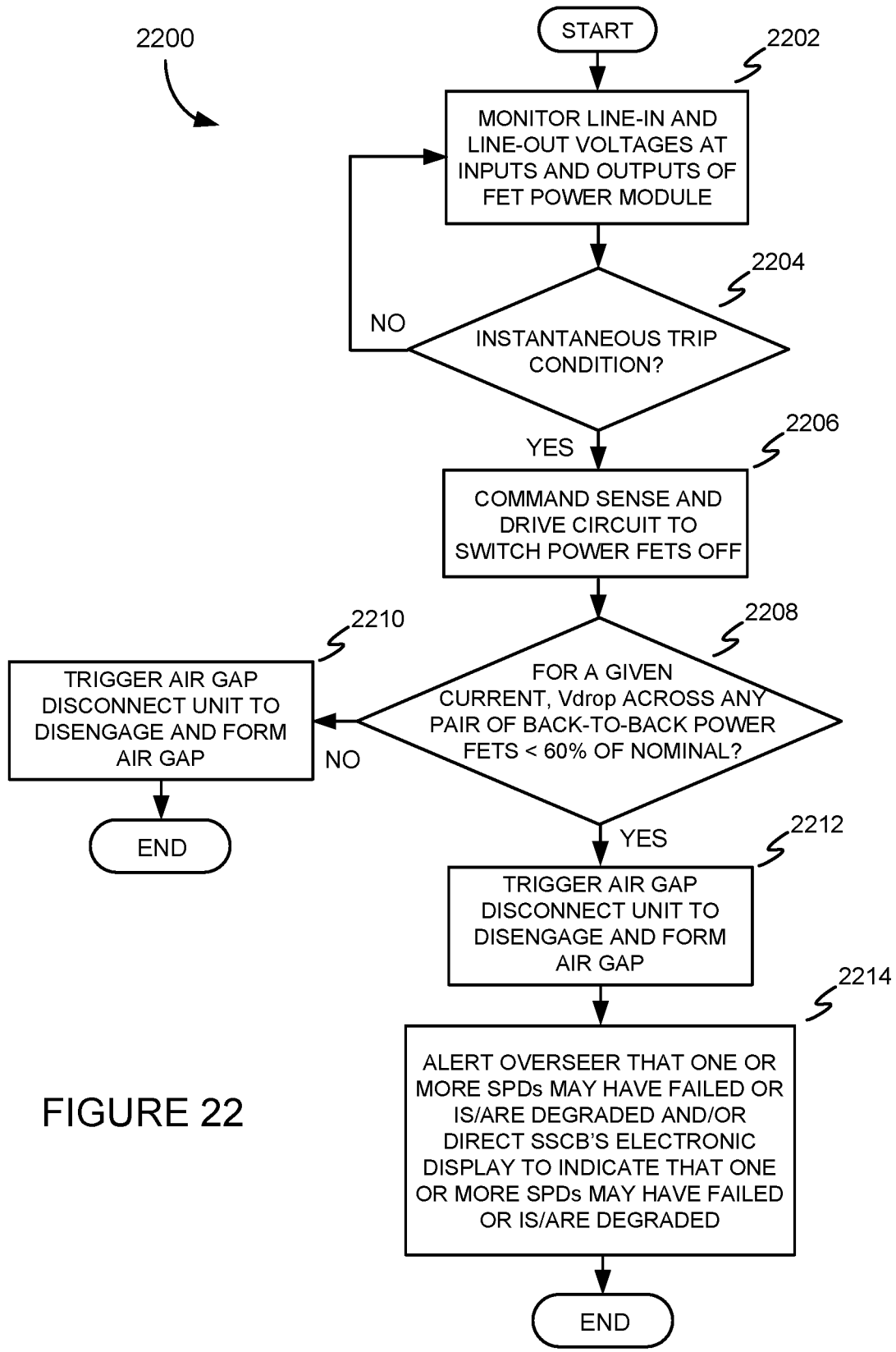
FIG. 22 is a flowchart illustrating a method the MCU of the SSCB performs to monitor the health of the SPDs in the FET power module, and what actions the MCU takes upon determining that one or more of the SPDs has/have failed, according to one embodiment of the present invention.

In one embodiment of the invention each of the three phases of the SSCB 100 includes a pair of back-to-back power FETs 116, rather than just a single power FET, as illustrated in FIG. 21. The back-to-back power FET configuration is desirable in some applications since among other attributes it facilitates soft starting of inductive motor loads, similar to as explained in previously referred to and commonly assigned U.S. Pat. No. 10,541,530. During an instantaneous trip condition (e.g., when one or more of the line currents exceeds some multiple of the SSCB's 100's rated current $I_{RATED}$ (e.g., x6 $I_{RATED}$), the sense and drive circuit 104 switches the power FETs 116 OFF. When the power FETS 116 are switched OFF in this circumstance, a high-voltage ringing can develop across the SSCB 100, specifically, between drain-to-drain of one or more of the back-to-back power FETs 116. In the version of the FET power module 106 depicted in FIG. 21, surge protection devices (SPDs) 2102, e.g., metal-oxide varistors (MOVs) or transient-voltage-suppression (TVS) diodes, are connected across each pair of back-to-back power FETs 116 in each phase. The SPDs 2102 turn ON, during the instantaneous trip condition if the voltage developed across them exceeds some predetermined threshold. When turned ON, the SPDs 2102 clamp the voltage across the drain-to-drain of each back-to-back power FET configuration to prevent the high-voltage ringing. However, the SPDs 2102 can only withstand so many high voltage suppressions before they begin to degrade and eventually fail. In one embodiment of the invention, the MCU 102 is configured to perform a method 2200 that monitors the health of the SPDs 2102 and to lock down the SSCB 100 if any one or more of the SPDs 2102 has failed or sufficiently degraded, so that an electrician or engineer can then be dispatched on site to service the SSCB 100 (e.g., by replacing the one or more failed or degraded SPDs 2102) or replacing the SSCB 100 with a new SSCB 100 having new SPDs 2102. FIG. 22 is a flowchart depicting an exemplary embodiment of this SPD health monitoring method 2200. First, at step 2202 the MCU 102 constantly monitors the Line-IN and Line-OUT voltages at the inputs and outputs of the SSCB 100. Next, upon determining that an instantaneous trip condition is occurring at decision 2204 ("YES" at decision 2204), the sense and drive circuit 104 switches the power FETs 116 OFF at step 2206. Once the power FETs 116 have been switched OFF, at decision 2208 the MCU 102 determines (based on voltage measurements taken by the Line-IN and Line-OUT current/voltage sensors 154 and 156) whether the voltage drop Vdrop across any pair of back-to-back power FETs 116, i.e., the voltage drop Vdrop across any SPD 2102, is less than some predetermined minimum voltage threshold (in one exemplary embodiment, less than 60% of the SPD's nominal voltage drop). (Note that since each SPD 2102 is connected across its associated back-to-back power FETs 116 drain-to-drain, Vdrop across each pair of back-to-back power FETs 116 is the same as the voltage dropped across its associated SPD 2002.) In one embodiment of the invention Vdrop for each phase is the average voltage drop Vdrop(avg) determined based on a series of instantaneous voltage drop measurements taken during the instantaneous trip condition event. For each phase, absolute instantaneous voltage drop measurements are taken on each execution cycle of the MCU 102, and the MCU 102 looks for a plateau by checking the instantaneous values to the previous values. To determine the average voltage drop Vdrop(avg) for each pair of back-to-back power FETs 116, the absolute instantaneous voltage drop measurements in the plateau region are added to an accumulator for a given current level. This loop also counts the time period of the plateau. Using the counted time period and accumulator value, the average voltage drop Vdrop(avg) is then computed for a defined current. This is repeated for all three phases, resulting in average clamp voltage levels and time periods of the three phase plateau regions. Due to the nature of a three-phase system, two of the SPDs 2102 will be affected in a similar fashion during an instantaneous trip condition event. As decision 2208 is being performed, the two affected phases are identified by measuring current, and once identified the MCU 102 determines whether Vdrop (avg) for either of the two identified phases has dropped below the predetermined minimum voltage threshold. If the MCU 102 determines at decision 2208 that all SPDs 2102 are still working as intended (i.e., a "NO" at decision 2208), at step 2210 the MCU 102 generates a solenoid trigger signal to cause the air gap disconnect unit 108 to disengage and form an air gap between the Line-IN and Line-OUT terminals 110 and 112 and thereby respond to the instantaneous trip condition that was previously detected at decision 2204. On the other hand, if the MCU 102 determines at decision 2208 that Vdrop(avg) in any of the three phases has fallen to a level less than the predetermined minimum voltage threshold (i.e., a "YES" at decision 2208) the MCU 102 is able to properly conclude that one or more of the SPDs 2102 has/have likely failed or has/have sufficiently degraded (for having suppressed too many voltage surges) that they should be replaced. Accordingly, if a "YES" results at decision 2208, at step 2212 the MCU 102 generates a solenoid trigger signal to cause the air gap disconnect unit 108 to disengage and form an air gap between the Line-IN and Line-OUT terminals 110 and 112. Finally, at step 2214, the MCU 102 alerts the system overseer that one or more of the SPDs 2102 in the SSCB 100 has/have likely failed or has/have sufficiently degraded to a point that it/they need to be replaced and/or causes the SSCB's 100's electronic display 113 to indicate that one or more of the SPDs 2102 has/have likely failed or has/have sufficiently degraded to a point that it/they need to be replaced.

As explained in detail above, it is preferable to first turn the power FETs 116 in the FET power module 106 OFF before forming the air gap, so that arcing does not occur across the air gap. To facilitate this operation, in one embodiment of the invention the RELEASE button 122 (see FIGS. 1-3 and 5) is equipped with a microswitch that opens and closes depending on the physical displacement of the RELEASE button 122. (In a preferred embodiment of the SSCB 100, two tactile mechanical switches 115 (see FIG. 3) are used (two for redundancy).) The microswitch is in electrical communication with the MCU 102, allowing the MCU 102 to monitor its status, i.e., open or closed. So long as the RELEASE button 122 is in its natural state (not pushed), the microswitch remains closed. However, upon a person pressing the RELEASE button 122 and as the RELEASE button moves into the SSCB enclosure, the microswitch opens. When the MCU 102 detects this change in status of the microswitch, it immediately responds by directing the sense and drive circuit 104 to switch the power FETs 116 in the FET power module 106 OFF. The power FETs 106 are switched OFF very quickly in this process, well before the air gap disconnect unit 108 is able to complete forming the air gap. In this way, arcing across the air gap is prevented.

Figure 23:
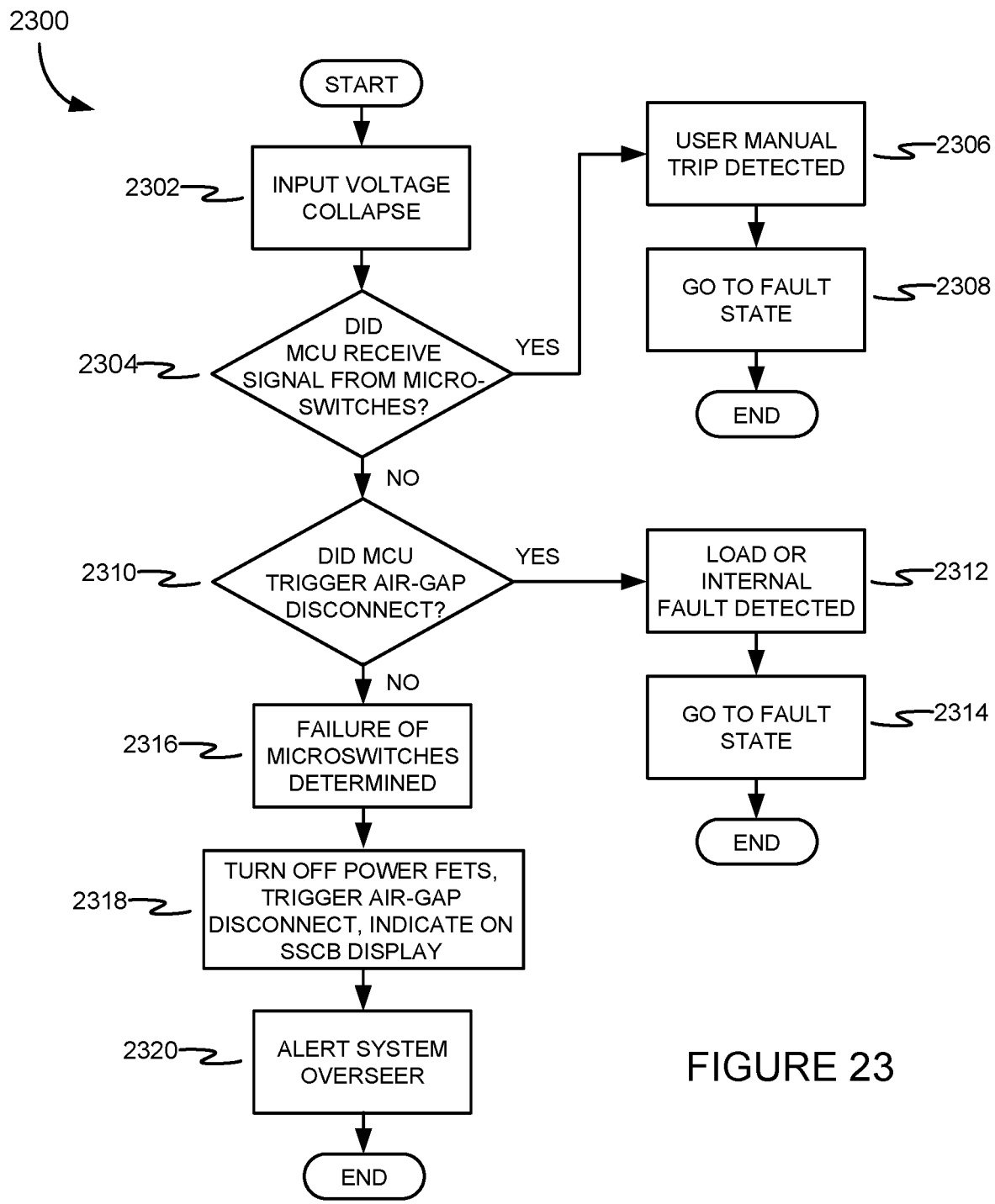
FIG. 23 is a flowchart illustrating a method the MCU of the SSCB performs to monitor the operational status of one or more microswitches that are configured to indicate a physical displacement of the SSCB's RELEASE button, and what actions the MCU performs upon determining that one or more of the one or more microswitches has failed, according to one embodiment of the present invention.

In one embodiment of the invention the computer program instructions stored in the CRM 103 and retrieved and executed by the MCU 102 not only enable the MCU 102 to monitor the operational status of the one or more microswitches 115, they further include instructions that enable the MCU 102 to: determine whether the one or more microswitches 115 has/have failed, respond to any determined failure, for example, by locking down the SSCB 100, and inform the system overseer of any failure. FIG. 23 is a flowchart illustrating a method 2300 the MCU 102 performs, according to this particular aspect of the invention. First, immediately following a voltage collapse at the input of the SSCB 100 but not in DC power of the internal power supply (step 2302), at decision 2304 the MCU 102 determines whether it received a change in status signal from the one or more microswitches 115 indicative of a person pressing the RELEASE button 122. If "YES" at decision 2304, the MCU 102 is able to properly conclude at step 2306 that the RELEASE button 122 was in fact pressed, and at step 2308 enters a fault state (power FETs 116 switched OFF and air gap disconnect unit 108 disengaged). If, on the other hand, the MCU 102 does not receive a signal from the one more microswitches 115 ("NO" at decision 2304), the possibility still remains that a person did press the RELEASE button 122 but for some reason the MCU 102 did not receive a signal indicating that it had been pressed. To determine if the RELEASE button 122 was in fact pressed but that the one or more microswitches 115 may have failed, decision 2310 is performed. Specifically, at decision 2310 the MCU 102 queries as to whether the SSCB 100 initiated the command to trigger the air gap disconnect unit 108 (automatically by triggering the solenoid 118) upon the Line-IN voltage sensors 154 detecting the voltage collapse at the SSCB input. If it did ("YES" at decision 2310), at step 2312 the MCU 102 concludes that the SSCB 100 responded automatically to the fault (without a person pressing the RELEASE button 122) and at step 2314 commands the SSCB 100 to enter a fault state (power FETs 116 switched OFF and air gap disconnect unit 108 disengaged). On the other hand if the MCU 102 did not receive a change-in-status signal from the one more microswitches 115 ("NO" at decision 2304) and the MCU 102 did not initiate the command to trigger the air gap disconnect unit 108 ("NO"

at decision 2310), the MCU 102 concludes at step 2316 that a person did in fact press the RELEASE button 122 but for some reason the MCU 102 did not receive the signal from the one or more microswitches 115 upon the RELEASE button 122 being pressed. In other words, at step 2216 the MCU 102 is able to properly conclude that although a person did in fact press the RELEASE button 122 the one or more microswitches 115 has/have likely failed. After making this determination, at step 2318 the MCU 102 directs the sense and drive circuit 104 to switch OFF the power FETs 116, trigger the air gap disconnect unit 108 to disengage, and indicate on the SSCB's 100's electronic display 113 that the one or more microswitches 115 has/have likely failed. Finally, at step 2320 the MCU 102 reports to the system overseer (via comm/control bus 124) that the one or more microswitches 115 has/have likely failed and need to be replaced.

Figure 24:
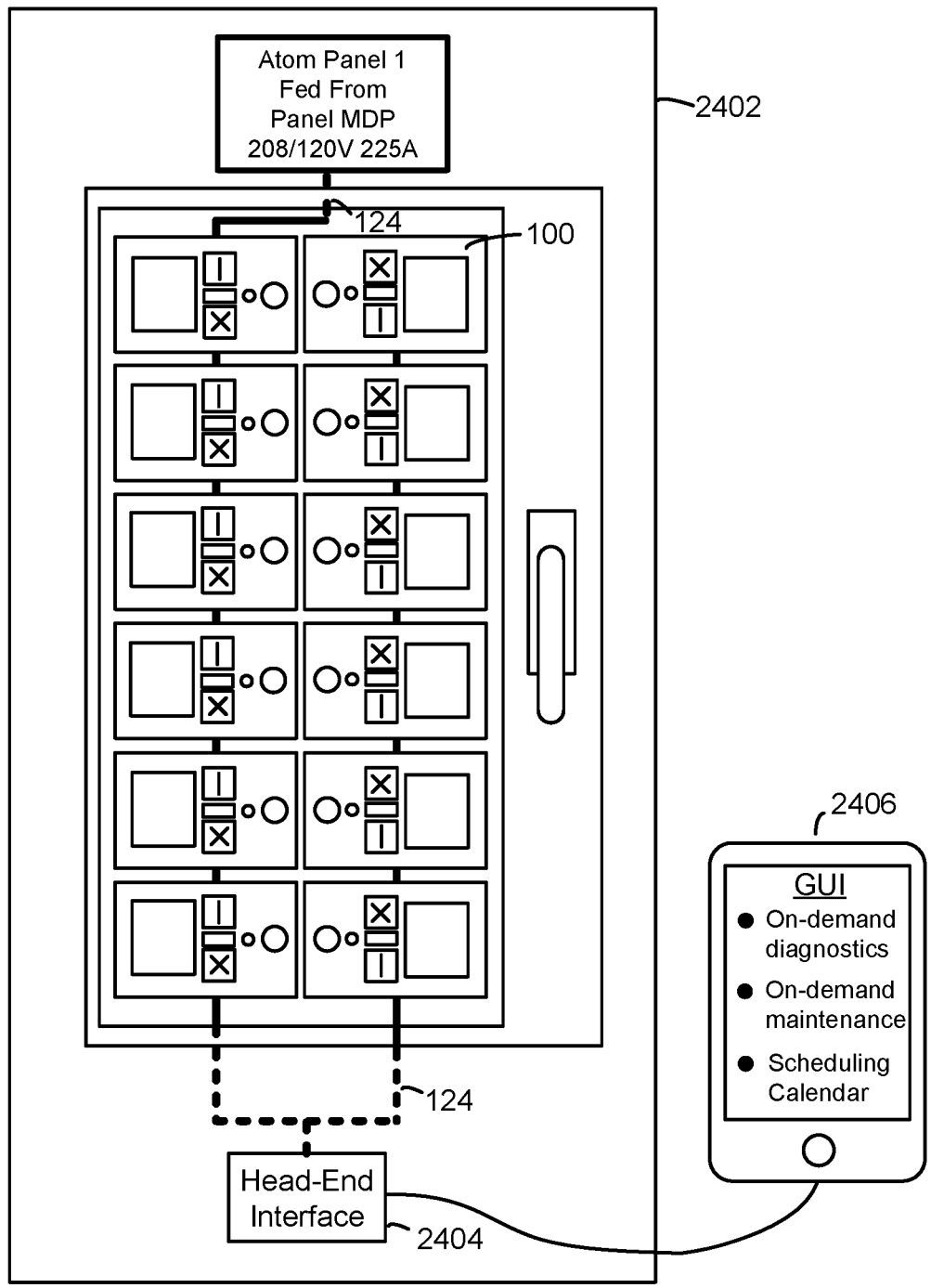
FIG. 24 is a drawing showing a plurality of the SSCBs configured in a an electrical distribution panel, how the SSCBs are in electrical communication with a communications and control (comm/control) bus with a head-end interface, and how an external local or remotely located computer (a tablet computer in the drawing), can be used perform on-demand SSCB diagnostics and maintenance, and schedule, via a user-interactive graphical user interface (GUI), periodic SSCB diagnostic and/or maintenance, in accordance with one embodiment of the present invention.
Figure 25:
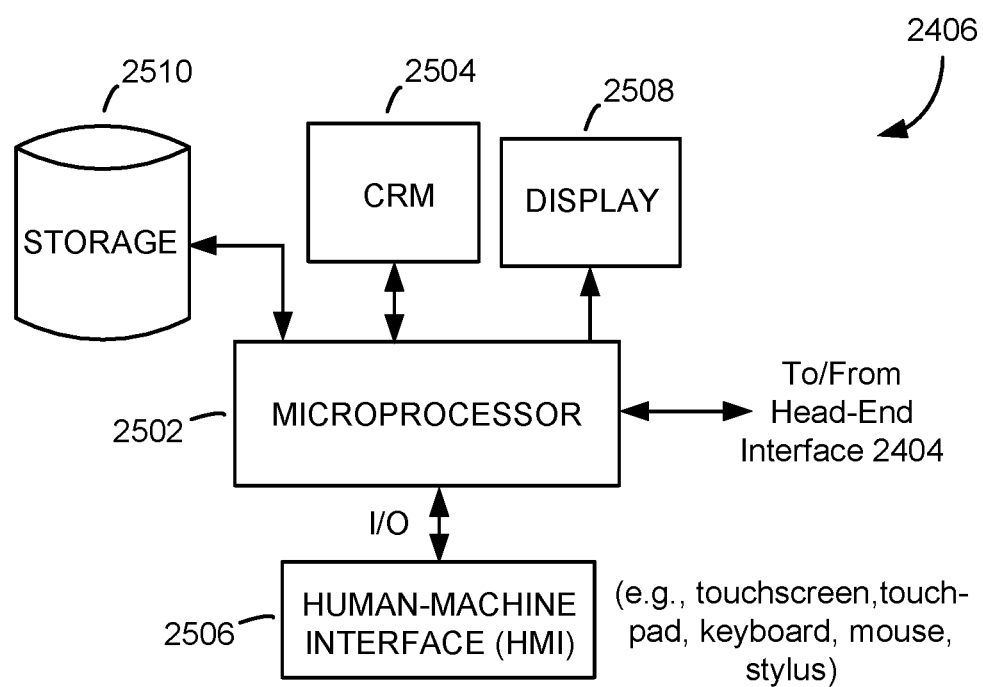
FIG. 25 is a block diagram highlighting the salient components of the external local or remotely controlled computer used to perform the on-demand SSCB diagnostics and maintenance, and schedule, via the user-interactive GUI, periodic SSCB diagnostic and/or maintenance.

In the exemplary embodiments of the invention described above, the SSCB 100 is designed so that it can perform the various diagnostic, maintenance, and self-protection methods without any human intervention. In some embodiments of the invention, the SSCB 100 is designed so that many of the various methods described above can also be (or alternatively be) performed on-demand, i.e., initiated by a user, for example, by an electrician, engineer, or electrical utility. To facilitate this on-demand capability when the SSCB 100 is installed in a distribution panel 2402 (see FIG. 24), the SSCB 100, its MCU 102 in particular, is programmed to communicate with an external user computer 2406 via a wired (or wireless) head-end interface 2404 configured in the distribution panel 2402. FIG. 25 is a drawing showing the principal components of the user computer 2406, which may comprise a server, desktop computer, laptop computer, tablet computer, smartphone, or any other type of computing device. As indicated in the drawing (FIG. 25), the user computer 2406 includes a microprocessor 2502; CRM 2504; a human-machine interface (HMI) 2506 through which the user can interact with the user computer 2406; an electronic display 2508; and an optional mass storage device 2510 (e.g., a magnetic hard drive or a solid-state drive). The CRM 2504 is configured to store computer program instructions that direct how the microprocessor 2502 operates. These computer program instructions include instructions and protocol that provide the microprocessor 2502 the ability to communicate with the MCUs 102 in the various SSCBs 100 over the comm/control bus 124, via the head-end interface 2404, instructions that allow the microprocessor 2502 to individually address each one of the SSCBs 100, and instructions that control the times at which the microprocessor 2502 communicates with the MCUs 102 in the various SSCBs 100. In one embodiment of the invention, the user-interactive capability provided by the user computer 2406 is presented in the form of a user-interactive graphical user interface (GUI) and computer program instructions stored in the CRM 2504 of the user computer 2406 include instructions that direct the microprocessor 2502 to generate and display one or more GUI windows or pages on the user computer's electronic display 2508. Preferably, the electronic display 2508 is equipped with touchscreen technology, which enables the user of the user computer 2406 to interact with the GUI windows or pages by touching the screen of the electronic display 2508 or by using a stylus. Using simple or multi-touch gesture using one or more fingers, the user can scroll, zoom, input information, etc. and control what GUI windows or pages and content are being displayed on the electronic display 2508. The GUI and electronic display 2508 could alternatively (or additionally) be configured so that the user can interact with the GUI windows or pages and content using a mouse, touchpad, or other non-touchscreen input device. To facilitate user-interactivity, the GUI windows or pages preferably include icons and widgets, such as radio buttons, sliders, spinners, drop-down lists, menus, combo and text boxes, scrollbars, etc. The computer program instructions that the microprocessor 2502 executes to generate the GUI preferably comprises an app hosted on the local gateway; however, it could alternatively comprise a web service installed on a local sever or remotely (e.g., in the cloud). Preferably, the GUI includes a calendar that allows the user to schedule regular occurrences of diagnostics and/or maintenance, and user-interactive icons and/or widgets that allow the user to initiate on-demand diagnostics and/or maintenance. Whether scheduled or on-demand, the user computer's 2406's microprocessor 202 is preferably programmed to report back a GUI window or page that displays the results of any diagnostics and/or maintenance run, any failures (or predicted failures) of any of the various components of any given SSCB 100, and recommended corrective actions. To further facilitate on-demand diagnostics and/or maintenance, in one embodiment of the invention the SSCB 100 further includes an on-demand diagnostics button (e.g., labeled "test"), or, alternatively, the STANDBY button 111 is configured to serve as a dual purpose button which when pressed initiates the on-demand diagnostic and/or maintenance processes.

While various embodiments of the present invention have been described, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments but, instead, should be determined by the appended claims, including the full scope of equivalents to which such claims are entitled.

The invention claimed is:

1. A solid-state circuit breaker (SSCB), comprising:
   line-in and line-out terminals;
   a power semiconductor device configured between the line-in and line-out terminals;
   a sense and drive circuit configured to monitor a current flowing through the power semiconductor device and switch the power semiconductor device OFF upon detecting a short circuit or over overload of unacceptably long duration;
   an air gap disconnect unit connected in series with the power semiconductor device, between the line-in and line-out terminals, configured to form an air-gap between the line-in and line-out terminals after the sense and drive circuit has switched the power semiconductor device OFF; and
   a microcontroller unit (MCU) configured to monitor the operability of the power semiconductor device during normal operating conditions when the power semiconductor device is ON and no air gap is formed between the line-in and line-out terminals and upon determining that the power semiconductor device has failed, generate an alert indicating that the power semiconductor device has failed, and further configured to monitor the operability of the air gap disconnect unit and upon determining that the air gap disconnect unit has failed, direct the sense and drive circuit to switch the power semiconductor device OFF.

2. The SSCB of claim 1, wherein the MCU is operable to determine whether the air gap disconnect unit has failed open and also operable to determine whether the air gap disconnect unit has failed closed.

3. The SSCB of claim 2, wherein the MCU is configured to direct the sense and drive circuit to switch the power semiconductor device OFF, upon determining that the air gap disconnect unit has failed closed, and prevent the power semiconductor device from being switched back ON.

4. The SSCB of claim 1, wherein the SSCB further comprises a RESET button that a person can press to reengage the air gap disconnect unit and close the air gap, after the SSCB has tripped, and the MCU is configured to verify that the air gap disconnect unit has successfully reengaged in response to the RESET button being pressed before allowing the sense and drive circuit to switch the power semiconductor device back ON.

5. The SSCB of claim 4, wherein the RESET button includes a lockout-tagout (LOTO) hole through which a padlock or other locking device can be inserted to lock the RESET button and prevent the RESET button from being pressed to reengage the air gap disconnect unit.

6. The SSCB of claim 5, wherein the SSCB further comprises a secondary lockout mechanism that is triggered by the MCU upon the MCU determining that any one or more of the SSCB's principal components or principal functions has/have failed, and, once triggered, prevents the RESET button from being pressed to reengage the air gap disconnect unit, regardless of whether the padlock or other locking devices is inserted through the LOTO hole.

7. The SSCB of claim 1, wherein the SSCB further comprises a direct current (DC) power supply configured to supply DC power to the MCU and other DC components of the SSCB, and the MCU is configured to monitor an output voltage of the DC power supply and, upon determining that the output voltage has dropped below a predetermined threshold voltage, direct the sense and drive circuit to switch the power semiconductor device OFF.

8. The SSCB of claim 7, wherein the MCU is further configured to trigger the air gap disconnect unit to form the air gap between the line-in and line-out terminals, upon determining that the output voltage of the DC power supply has dropped below the predetermined threshold voltage.

9. The SSCB of claim 8, wherein the air gap disconnect unit comprises a solenoid, which triggers the air gap disconnect unit, and an air-gap disconnect capacitor that supplies current to actuate the solenoid, and the MCU is configured to monitor the operability of the air-gap disconnect capacitor and, upon determining that the air-gap disconnect capacitor has failed, enable a bypass circuit that bypasses the air-gap disconnect capacitor and temporarily configures the DC power supply to supply current to actuate the solenoid, instead of the air-gap disconnect capacitor.

10. The SSCB of claim 8, wherein the air gap disconnect unit comprises an air-gap disconnect capacitor and, upon the MCU determining that the output voltage of the DC power supply has dropped below the predetermined threshold voltage, the air-gap disconnect capacitor is configured to temporarily serve as a power supply for the MCU, instead of the DC power supply.

11. The SSCB of claim 1, further comprising a RELEASE button in mechanical communication with the air gap disconnect unit, which when pressed by a person manually disengages the air gap disconnect unit to form the air gap between the line-in and line-out terminals.

12. The SSCB of claim 11, wherein the RELEASE button is equipped with a microswitch that opens and closes depending on a physical displacement of the RELEASE button, and wherein the MCU is configured to monitor the operability of the microswitch and, upon determining that the microswitch has failed, direct the sense and drive circuit to switch the power semiconductor device OFF and/or direct the air gap disconnect unit to form the air gap between the line-in and line-out terminals.

13. The SSCB of claim 1, wherein the MCU is further configured to generate and provide operational status and diagnostic information concerning the SSCB.

14. The SSCB of claim 13, wherein the MCU is configured to generate and provide the operational status and diagnostic information automatically and, alternatively, on-demand or according to a predetermined schedule.

15. The SSCB of claim 13, further comprising a communications and control (comm/control) bus connector configured to connect to a comm/control bus, over which the MCU can transmit the operational status and diagnostic information to a local or remotely located computer.

16. The SSCB of claim 13, wherein the SSCB further comprises an electronic display configured to display the operational status and diagnostic information.

17. The SSCB of claim 1, wherein the SSCB further comprises line-in side and line-out side voltage sensors configured to sense or measure line-in side and line-out side voltages at input and output terminals of the power semiconductor device, and, when monitoring the operability of the power semiconductor device, the MCU is configured to:
   direct the sense and drive circuit to switch the power semiconductor device OFF temporarily;
   compute a voltage drop $\Delta V$ across the power semiconductor device using the line-in side and line-out side voltages sensed or measured by the line-in side and line-out side voltage sensors, and
   upon determining that the computed voltage drop $\Delta V$ is indicative of the power semiconductor device having failed closed, prevent any further attempt to switch the power semiconductor device back ON.

18. The SSCB of claim 1, wherein the SSCB further comprises a line-in current/voltage sensor configured between the air-gap disconnect unit and power semiconductor device and a line-out current/voltage sensor coupled to the line-out terminals, and the MCU is further configured to monitor the operability of the line-in and line-out current/voltage sensors and, upon determining that the line-in current/voltage sensor has failed, or, upon determining that the line-out current/voltage sensor has failed, direct the sense and drive circuit to switch the power semiconductor device OFF and/or trigger the air gap disconnect unit to form the air gap between the line-in and line-out terminals.

19. The SSCB of claim 1, wherein the MCU is configured to determine whether the power semiconductor device has failed closed, and upon determining that the power semiconductor device has failed closed, trigger the air gap disconnect unit to form the air gap between the line-in and line-out terminals.

20. The SSCB of claim 1, wherein the MCU is further configured to trigger the air gap disconnect unit to form the air gap between the line-in and line-out terminals upon a short circuit or over overload of unacceptably long duration occurring, regardless of whether the sense and drive circuit has successfully switched the power semiconductor device OFF.

21. The SSCB of claim 1, further comprising an electronic display configured to alert a person that the power semiconductor device has failed, after the MCU has determined that the power semiconductor device has failed.

22. The SSCB of claim 1, further comprising an electronic display configured to alert a person that the air gap disconnect unit has failed, after the MCU has determined that the air gap disconnect unit has failed.

23. The SSCB of claim 1, wherein the SSCB further comprises a thermistor, and the MCU is further configured to monitor the thermistor and, upon detecting a developing thermal runaway condition in the power semiconductor device, direct the sense and drive circuit to switch the power semiconductor device OFF.

24. The SSCB of claim 1, further comprising a watchdog circuit, external to the MCU, configured to monitor the operability of the MCU and switch the power semiconductor device OFF, or direct the sense and drive circuit to switch the power semiconductor device OFF, upon detecting that the MCU has failed.

25. The SSCB of claim 1, wherein the SSCB further comprises a surge protection device (SPD) configured to protect the power semiconductor device, and the MCU is configured to monitor the operability of the SPD and, upon determining that the SPD has failed, or has sufficiently degraded beyond its predicted and predetermined lifetime, trigger the air gap disconnect unit to form the air gap between the line-in and line-out terminals.

26. A solid-state circuit breaker (SSCB), comprising:
line-in and line-out terminals;
a power semiconductor device configured between the line-in and line-out terminals;
an air gap disconnect unit connected in series with the power semiconductor device, between the line-in and line-out terminals; and
a microcontroller unit (MCU) configured to monitor the operability of the power semiconductor device during normal operating conditions, when the power semiconductor device is ON, diagnose causes of failure of the power semiconductor device, and trigger the air gap disconnect unit to form an air gap between the line-in and line-out terminals following each diagnosed cause of failure of the power semiconductor device.

27. The SSCB of claim 26, wherein the SSCB further comprises a RESET button that a person can press to reengage the air gap disconnect unit and close the air gap, after the SSCB has tripped, and the MCU is configured to verify that the air gap disconnect unit has successfully reengaged in response to the RESET button being pressed before allowing the power semiconductor device to be switched back ON.

28. The SSCB of claim 27, wherein the RESET button includes a lockout-tagout (LOTO) hole through which a padlock or other locking device can be inserted to lock the RESET button and prevent the RESET button from being pressed to reengage the air gap disconnect unit.

29. The SSCB of claim 28, wherein the SSCB further comprises a secondary lockout mechanism that is triggered by the MCU upon the MCU diagnosing that a principal component or principal function of the SSCB has failed and that, once triggered, prevents the RESET button from being pressed to reengage the air gap disconnect unit, regardless of whether the padlock or other locking devices is inserted through the LOTO hole.

30. The SSCB of claim 26, wherein the SSCB further comprises a circuit that controls whether the power semiconductor device is switched ON or is switched OFF and a direct current (DC) power supply configured to supply DC power to the MCU and other DC components of the SSCB, and the MCU is configured to monitor an output voltage of the DC power supply and, upon determining that the output voltage has dropped below a predetermined threshold voltage, direct said circuit to switch the power semiconductor device OFF and/or trigger the air gap disconnect unit to form the air gap between the line-in and line-out terminals.

31. The SSCB of claim 30, wherein the air gap disconnect unit comprises a solenoid, which triggers the air gap disconnect unit, and an air-gap disconnect capacitor that supplies current to actuate the solenoid, and the MCU is configured to monitor the operability of the air-gap disconnect capacitor and, upon diagnosing a failure of the air-gap disconnect capacitor, enable a bypass circuit that bypasses the air-gap disconnect capacitor and temporarily configures the DC power supply to supply current to actuate the solenoid, instead of the air-gap disconnect capacitor.

32. The SSCB of claim 30, wherein the air gap disconnect unit comprises an air-gap disconnect capacitor and, upon the MCU determining that the output voltage of the DC power supply has dropped below the predetermined threshold voltage, the air-gap disconnect capacitor is configured to temporarily serve as a power supply for the MCU, instead of the DC power supply.

33. The SSCB of claim 26, further comprising a watchdog circuit, external to the MCU, configured to monitor the operability of the MCU and generate a signal to switch the power semiconductor device OFF, upon detecting a malfunction of the MCU.

34. The SSCB of claim 33, wherein the watchdog circuit is further configured to trigger the air gap disconnect unit to form the air gap between the line-in and line-out terminals, upon detecting the malfunction of the MCU.

35. The SSCB of claim 26, further comprising a RELEASE button in mechanical communication with the air gap disconnect unit, which when pressed by a person manually disengages the air gap disconnect unit to form the air gap between the line-in and line-out terminals.

36. The SSCB of claim 35, wherein the SSCB further comprises a circuit that controls whether the power semiconductor device is switched ON or is switched OFF and/or whether the air gap disconnect unit is configure to form the air gap between the line-in and line-out terminals, the RELEASE button is equipped with a microswitch that opens and closes depending on a physical displacement of the RELEASE button, and the MCU is configured to monitor the operability of the microswitch and, upon diagnosing a failure of the microswitch, direct said circuit to switch the power semiconductor device OFF and/or the air gap disconnect unit to form the air gap between the line-in and line-out terminals.

37. The SSCB of claim 26, further comprising an electronic display configured to display operational status and diagnostic information concerning the SSCB, including information concerning the operability and diagnosed causes of failure of both the air-gap disconnect unit and the power semiconductor device.

38. The SSCB of claim 37, wherein the electronic display comprises a display technology capable of continuing to display the operational status and diagnostic information even after electrical power to the electronic display has been removed.

39. The SSCB of claim 26, wherein the MCU is further configured to diagnose causes of failure of the air gap disconnect unit and generate and provide operational status and diagnostic information concerning the SSCB, including information concerning the operability and diagnosed causes of failure of both the air-gap disconnect unit and the power semiconductor device.

40. The SSCB of claim 39, wherein the MCU is configured to generate and provide the operational status and diagnostic information automatically and, alternatively, on-demand or according to a predetermined schedule.

41. The SSCB of claim 39, further comprising a communications and control (comm/control) bus connector configured to connect to a comm/control bus, over which the MCU can transmit the operational status and diagnostic information to a local or remotely located computer.

42. The SSCB of claim 26, wherein the SSCB further comprises a circuit that controls whether the power semiconductor device is switched ON or is switched OFF and line-in side and line-out side voltage sensors configured to sense or measure line-in side and line-out side voltages at input and output terminals of the power semiconductor device, and, when monitoring the operability of the power semiconductor device, the MCU is configured to:
 direct said circuit to switch the power semiconductor device OFF temporarily;
 compute a voltage drop $\Delta V$ across the power semiconductor device using the line-in side and line-out side voltages sensed or measured by the line-in side and line-out side voltage sensors, and
 upon determining that the computed voltage drop $\Delta V$ is indicative of the power semiconductor device having failed closed, prevent any further attempt to switch the power semiconductor device back ON.

43. The SSCB of claim 42, wherein after determining that the computed voltage drop $\Delta V$ is indicative of the power semiconductor device having failed closed, the MCU is configured to prevent any further attempt to switch the power semiconductor device back ON only if the air gap disconnect unit has not already exceeded a predetermined number of air gap arc exposures.

44. The SSCB of claim 42, wherein the MCU is operable to diagnose whether the air gap disconnect unit has failed open and also operable to diagnose whether the air gap disconnect unit has failed closed.

45. A solid-state circuit breaker (SSCB), comprising:
 a power semiconductor device coupled between an electrical power source and an electrical load when configured in an electrical circuit, said power semiconductor device configured to remain ON during normal operating conditions when electrical power is being delivered to the load but controlled to switch OFF to electrically isolate the load upon a short circuit or other electrical anomaly occurring in the electrical circuit;
 a control circuit that controls whether the power semiconductor device is switched ON or is switched OFF; and
 a microcontroller unit (MCU) configured to monitor the operability of the power semiconductor device and other principal components of the SSCB, and, upon determining that the SSCB has discontinued to operate as intended:
 perform a plurality of diagnostic tests and diagnose a cause as to why the SSCB has discontinued to operate as intended, and
 lock the SSCB down to electrically isolate the load after diagnosing the cause as to why the SSCB has discontinued to operate as intended,
 wherein locking the SSCB down includes directing the control circuit to switch the power semiconductor device OFF if the diagnosed cause as to why the SSCB has discontinued to operate as intended relates to a malfunction of the power semiconductor device.

46. The SSCB of claim 45, wherein the SSCB further comprises an air gap disconnect unit connected in series with the power semiconductor device, between line-side and load-side terminals of the SSCB, and the MCU is further configured to monitor the operability of the air gap disconnect unit and, upon determining that the SSCB has discontinued to operate as intended, identify a failure of the air gap disconnect unit as the cause as to why the SSCB has discontinued to operate as intended.

47. The SSCB of claim 46, wherein the MCU is operable to diagnose that the air gap disconnect unit has failed closed.

48. The SSCB of claim 46, wherein the MCU is operable to diagnose that the air gap disconnect unit has failed open.

49. The SSCB of claim 46, wherein the air gap disconnect unit comprises a solenoid and a capacitor configured to store energy for actuating the solenoid, and the MCU is further configured to monitor the operability of the capacitor and diagnose problems relating to its operation.

50. The SSCB of claim 49, wherein the SSCB further comprises a direct current (DC) power supply, and the MCU is further configured to monitor the operability of the DC power supply and diagnose problems relating to its operation.

51. The SSCB of claim 50, wherein the SSCB further comprises a bypass circuit configured to bypass the capacitor and configure the DC power supply to supply current to actuate the solenoid, instead of the capacitor, after the MCU diagnoses a problem relating to the operation of the capacitor.

52. The SSCB of claim 49, wherein the solenoid is further configured to serve as a sensor that generates an electrical pulse as the air gap disconnect unit is being reengaged, after having been previously disengaged and after the power semiconductor device having been previously switched OFF, and the MCU is configured to wait to receive the electrical pulse before allowing the power semiconductor device to be switched back ON.

53. The SSCB of claim 52, wherein the MCU is further configured to compare a shape of the electrical pulse to a shape of an expected pulse and prevent the power semiconductor device from being switched back ON if the shape of the electrical pulse does not match the shape of the expected pulse.

54. The SSCB of claim 45, wherein the SSCB further comprises a watchdog circuit that is configured to receive a heartbeat signal from the MCU and that causes the power semiconductor device to switch OFF upon detecting that the heartbeat signal is no longer being received from the MCU.

55. The SSCB of claim 54, wherein the SSCB further comprises an air gap disconnect unit connected in series with the power semiconductor device, and the watchdog circuit is further configured to generate a trigger signal that triggers the air gap disconnect unit to galvanically isolate the load upon detecting that the watchdog heartbeat signal is no longer being received from the MCU.

56. The SSCB of claim 45, further comprising an electronic display configured to display information that informs a person that the SSCB is not operating as intended, including information about the diagnosed cause as to why the SSCB is not operating as intended.

57. The SSCB of claim 45, wherein the MCU is further configured to report to a local or remotely located computer that the SSCB is not operating as intended and inform the local or remotely located computer of the diagnosed cause as to why the SSCB is not operating as intended.

58. The SSCB of claim 45, wherein the SSCB further comprises line-side and load-side voltage sensors configured to sense first and second voltages at line-side and load-side terminals of the power semiconductor device, the MCU is configured to receive the first and second voltages and compute a voltage drop across the power semiconductor device and, depending on the computed voltage drop diagnose that the power semiconductor device has failed closed and is the cause as to why the SSCB has discontinued to operate as intended.

59. The SSCB of claim 26, wherein the SSCB further comprises a circuit that controls whether the power semiconductor device is switched ON or is switched OFF and the MCU is configured to direct said circuit to switch the power semiconductor device OFF, upon diagnosing that the air gap disconnect unit has failed closed, and prevent the power semiconductor device from being switched back ON.

60. The SSCB of claim 26, wherein the SSCB further comprises a circuit that controls whether the power semiconductor device is switched ON or is switched OFF, a line-in current/voltage sensor configured between the air-gap disconnect unit and the power semiconductor device, and a line-out current/voltage sensor coupled to the line-out terminals, and the MCU is further configured to monitor the operability of the line-in and line-out current/voltage sensors and, upon diagnosing that the line-in current/voltage sensor has failed, or, upon diagnosing that the line-out current/voltage sensor has failed, direct said circuit to switch the power semiconductor device OFF and/or trigger the air gap disconnect unit to form the air gap between the line-in and line-out terminals.

61. The SSCB of claim 26, wherein the SSCB further comprises a thermistor adjacent to the power semiconductor device, and the MCU is further configured to monitor the thermistor and, upon diagnosing a thermal runaway condition in the power semiconductor device, switch the power semiconductor device OFF, or direct a drive circuit to switch the power semiconductor device OFF.

62. The SSCB of claim 26, wherein the SSCB further comprises a surge protection device (SPD) configured to protect the power semiconductor device, and the MCU is configured to monitor the operability of the SPD and, upon diagnosing that the SPD has failed or determining that the SPD has sufficiently degraded beyond its predicted and predetermined lifetime, trigger the air gap disconnect unit to form the air gap between the line-in and line-out terminals.

* * * * *